(12) United States Patent
Chen et al.

(10) Patent No.: US 11,581,037 B2
(45) Date of Patent: Feb. 14, 2023

(54) DIGITAL COMPUTE-IN-MEMORY (DCIM) BIT CELL CIRCUIT LAYOUTS AND DCIM ARRAYS FOR MULTIPLE OPERATIONS PER COLUMN

(71) Applicant: QUALCOMM Incorporated, San Diego, CA (US)

(72) Inventors: Xiaonan Chen, San Diego, CA (US); Zhongze Wang, San Diego, CA (US); Yandong Gao, San Diego, CA (US); Mustafa Badaroglu, Flemish Brabant (BE)

(73) Assignee: QUALCOMM Incorporated, San Diego, CA (US)

( * ) Notice: Subject to any disclaimer, the term of this patent is extended or adjusted under 35 U.S.C. 154(b) by 84 days.

(21) Appl. No.: 17/341,797

(22) Filed: Jun. 8, 2021

(65) Prior Publication Data

US 2022/0392524 A1 Dec. 8, 2022

(51) Int. Cl.

| | |
|---|---|
| *G11C 11/419* | (2006.01) |
| *G11C 11/4094* | (2006.01) |
| *G06F 7/544* | (2006.01) |
| *G11C 11/4091* | (2006.01) |
| *G06N 3/063* | (2006.01) |
| *G11C 11/4097* | (2006.01) |

(52) U.S. Cl.
CPC .......... *G11C 11/419* (2013.01); *G06F 7/5443* (2013.01); *G06N 3/063* (2013.01); *G11C 11/4091* (2013.01); *G11C 11/4094* (2013.01); *G11C 11/4097* (2013.01)

(58) Field of Classification Search
CPC .......................... G06F 7/5443; G11C 11/4094
USPC .................................................. 365/189.011
See application file for complete search history.

(56) References Cited

U.S. PATENT DOCUMENTS

| | | | |
|---|---|---|---|
| 10,276,579 B2 | 4/2019 | Fujiwara et al. | |
| 10,748,603 B2 | 8/2020 | Sumbul et al. | |
| 10,964,362 B2 * | 3/2021 | Jiang ...................... | G06N 3/084 |

(Continued)

OTHER PUBLICATIONS

Chang, M-F. et al., "Session 16 Overview: Computation in Memory," 2021 IEEE International Solid-State Circuits Conference (ISSCC) Digest of Technical Papers, Feb. 17, 2021, IEEE, pp. 244 254.

(Continued)

*Primary Examiner* — Anthan Tran
(74) *Attorney, Agent, or Firm* — Qualcomm Incorporated

(57) ABSTRACT

Digital compute-in-memory (DCIM) bit cell circuit layouts and DCIM array circuits for multiple operations per column are disclosed. A DCIM bit cell array circuit including DCIM bit cell circuits comprising exemplary DCIM bit cell circuit layouts disposed in columns is configured to evaluate the results of multiple multiply operations per clock cycle. The DCIM bit cell circuits in the DCIM bit cell circuit layouts each couples to one of a plurality of column output lines in a column. In this regard, in each cycle of a system clock, each of the plurality of column output lines receives a result of a multiply operation of a DCIM bit cell circuit coupled to the column output line. The DCIM bit cell array circuit includes digital sense amplifiers coupled to each of the plurality of column output lines to reliably evaluate a result of a plurality of multiply operations per cycle.

17 Claims, 13 Drawing Sheets

(56) References Cited

U.S. PATENT DOCUMENTS

2020/0301668 A1* 9/2020 Li .......................... G11C 11/54

OTHER PUBLICATIONS

International Search Report and Written Opinion for International Patent Application No. PCT/US2022/071790, dated Sep. 1, 2022, 13 pages.

* cited by examiner

DIGITAL COMPUTE-IN-MEMORY (DCIM) BIT CELL CIRCUIT LAYOUTS AND DCIM ARRAYS FOR MULTIPLE OPERATIONS PER COLUMN

BACKGROUND

I. Field of the Disclosure

The field of the disclosure relates generally to compute-in-memory (CIM) bit cells and arrays used in circuits for high-speed parallel data processing, such as neural networks.

II. Background

Machine learning is one example of artificial intelligence (AI) that can be implemented in a processing device, such as a neural network. Using AI, an application can make decisions based on historical data, receive feedback on the accuracy of those decisions, and make adjustments in the historical data to improve future decision making. A neural network implementing machine learning performs many operations in the nodes of an array. Each node performs a multiply-accumulate (MAC) operation in which a set of inputs is multiplied by a set of weight data in a multiplication operation and the products are summed. Each decision made by an application can include thousands of calculations and the weight data can be updated based on the feedback of each decision to increase accuracy of the application.

FIG. 1 is an illustration of a node 100 of a neural network configured to perform a MAC operation. The node 100 stores a number (M+1) of weight values $W_0$-$W_M$ that are multiplied by corresponding activation inputs $X_0$-$X_M$. The weight values $W_0$-$W_M$ are stored information that is based on feedback from previous calculations and the weight values $W_0$-$W_M$ may be updated over time to improve accuracy of the node 100. The multiply operations produce products $P_0$-$P_M$, which are added together in an accumulation function $\Sigma$ to generate a sum SUM. The node 100 generates an output OUT that is a function AF (e.g., activation function) of the sum SUM.

To implement the node 100 in a processing circuit, each of the M+1 multiplications is performed by one of M+1 bit cells in a compute-in-memory (CIM) array. The activation input data and weight data may each be single bit or multi-bit binary values. Each bit cell of the CIM array includes a memory bit cell for storing a bit of the weight data and also includes a binary multiplication circuit configured to multiply the weight data by an activation input. A multiplication of two one-bit binary data values in a CIM bit cell may be implemented as a logical AND-based operation (e.g., AND or Not AND (NAND)) or as a logical OR-based operation (e.g., OR, Not OR (NOR), or an exclusive-OR operation (e.g., XOR, NOT XOR (XNOR)). The CIM bit cells in a CIM array bit cell circuit may be organized in rows and columns, such that activation inputs are received in each row and the result of a multiplication is output on a column output line.

FIG. 2 is an illustration of an example of a digital compute-in-memory (DCIM) bit cell array circuit 200 including columns 202(0)-202(127) of DCIM bit cell circuits 204(0,0)-204(31,127) and column output lines 206(0)-206(127). Each of the DCIM bit cell circuits 204(0,0)-204(31,127) may have a conventional layout configured to couple to a corresponding one of the column output lines 206(0)-206(127). The columns 202(0)-202(127) are configured to operate in parallel. Details and operation of the column 202(0) are described as an example. The column output line 206(0), for example, is coupled to each of the DCIM bit cell circuits 204(0,0)-204(31,0) in the column 202(0). The DCIM bit cell circuits 204(0,0)-204(31,0) store weight data 208(0,0)-208(31,0). The DCIM bit cell array circuit 200 receives activation inputs ACT(0)-ACT(31). One of the activation inputs ACT(0)-ACT(31) is activated in a period of a system clock (not shown). Over the course of thirty-two (32) cycles of the system clock, each of the activation inputs ACT(0)-ACT(31) may be activated consecutively to generate activation input signals 212(0)-212(31). In each of the 32 cycles of the system clock, the activated one of the activation inputs ACT(0)-ACT(31) is multiplied by a corresponding one of the weight data 208(0,0)-208(31,0) in a corresponding one of the DCIM bit cell circuits 204(0,0)-204(31,0). The multiply results from the DCIM bit cell circuits 204(0,0)-204(31,0) are generated consecutively on the column output line 206(0) during the 32 cycles. The column output line 206(0) is configured to provide a binary result of a multiply operation in the column 202(0) to a sense amplifier 210(0). The column output lines 206(1)-206(127) are configured to provide binary results to sense amplifiers 210(1)-210(127) in the same cycle of the system clock.

In a cycle in which the activation input ACT(0) is activated, the activation input signal 212(0) is multiplied by the weight data 208(0,0). In the same cycle, the activation input signal 212(0) is also multiplied by each of the weight data 208(0,1)-208(0,127), Thus, the multiply results from the DCIM bit cell circuits 204(0,1)-204(0,127) are generated on the column output lines 206(1)-206(127) in the same clock cycle as the result in the column 202(0) is generated on the column output line 206(0). The multiply results on the column output lines 206(0)-206(127) are sensed by the sense amplifiers 210(0)-210(127) in the first cycle and stored in accumulator 214, which accumulates results for each of the columns 202(0)-202(127).

In another cycle of the system clock, which may be the next cycle after the activation input ACT(0) is activated, the activation input ACT(1) is activated and the multiply results of DCIM bit cell circuits 204(1,0)-204(1,127) are generated on the column outputs 208(0)-208(127). The multiply results on the column output lines 206(0)-206(127) are sensed by the sense amplifiers 210(0)-210(127) in the second cycle and added to the stored results from the first cycle in an accumulated total (not shown). The activation inputs ACT(2)-ACT(127) are consecutively activated in subsequent cycles until the multiply results of the DCIM bit cell circuits 204(31,0)-204(31,127) are generated on the column outputs 208(0)-208(127). In each cycle, the multiply results in each of the columns 202(0)-202(127) are added to previous results accumulated in the accumulator 214. In this manner, the DCIM bit cell array circuit 200 may evaluate the results of multiply operations in all of the DCIM bit cell circuits 204(0,0)-204(31,127) after 32 cycles of the system clock.

The sense amplifier 210(0) in the example described above may be a digital sense amplifier or may be another circuit configured to distinguish between one of two voltages that indicate a binary "0" and a binary "1" used in digital logic. In an alternative approach, in an analog CIM array circuit configured as shown in FIG. 2, the sense amplifier 210(0) may be an analog sense amplifier. In an analog CIM array circuit, more than one of the activation inputs ACT(0)-ACT(31) may be activated to generate a plurality of the activation input signals 212(0)-212(31) in a same cycle of the system clock. In an example, the activation inputs ACT(0)-ACT(4) may be activated to generate the activation input signals 212(0)-212(3) in a cycle and results of the multiply operations in the analog CIM bit cell arrays (0,0)-(3,0) may be generated on the column output line 206(0) in a same cycle. Thus, the analog sense amplifier 210(0) attempts to distinguish among a plurality of currents, for example, that indicate how many of the binary multiply operations resulted in a binary "1". Although an analog CIM bit cell circuit may require fewer cycles to evaluate the results of multiple multiply operations, the results evaluated by analog sense amplifiers may not be as reliable as results evaluated by digital sense amplifiers.

SUMMARY OF THE DISCLOSURE

Aspects disclosed herein include digital compute-in-memory (DCIM) bit cell circuit layouts and DCIM array circuits for multiple operations per column. A DCIM bit cell array circuit including DCIM bit cell circuits comprising exemplary DCIM bit cell circuit layouts disposed in columns is configured to evaluate the results of multiple multiply operations per clock cycle. In exemplary aspects, the DCIM bit cell circuits in the exemplary DCIM bit cell circuit layouts each couple to one of a plurality of column output lines in a column. In this regard, in each cycle of a system clock, each of the plurality of column output lines can receive a result of a multiply operation of a DCIM bit cell circuit coupled to the column output line. Performing and evaluating a plurality of multiply operations per column in each clock cycle can reduce the time to perform a multiply-accumulate (MAC) operation in the DCIM bit cell array circuit. In another exemplary aspect, the DCIM bit cell array circuit includes digital sense amplifiers coupled to each of the plurality of column output bit lines to reliably evaluate a result of a plurality of multiply operations per cycle. This is, for example, in contrast to analog compute-in-memory (CIM) bit cell arrays in which the results of a plurality of multiply operations are merged on a single column output line where analog sense amplifiers attempt to distinguish among a plurality of discrete values with low reliability.

In exemplary aspects disclosed herein, a DCIM bit cell array circuit is disclosed. The DCIM bit cell array circuit comprises a plurality of bit cell circuits in a column of bit cell circuits, a first column output line coupled to at least one of the plurality of bit cell circuits in the column of bit cell circuits; and a second column output line coupled to at least one of the plurality of bit cell circuits in the column of bit cell circuits. The plurality of bit cell circuits comprises a first bit cell circuit and a second bit cell circuit, wherein each of the plurality of bit cell circuits comprises a ground voltage node and a memory bit cell circuit configured to store a true weight data on a true bit line, and store a complement weight data on a complement bit line. The memory bit cell circuit comprises a complement pull-down transistor configured to couple the complement bit line to the ground voltage node in response to the true weight data. Each of the plurality of bit cell circuits also comprises a multiply circuit comprising a product signal line configured to couple to one of the first column output line and the second column output line, an activation input configured to receive an activation input signal, and a weight data signal line coupled to the true bit line of the memory bit cell circuit, and the multiply circuit is configured to generate a result of a multiply operation of the activation input signal and the true weight data on the product signal line comprising coupling the product signal line to the ground voltage node in response to the activation input signal and the true weight data, the product signal line of the first bit cell circuit is coupled to the first column output line, and the product signal line of the second bit cell circuit is coupled to the second column output line.

In another exemplary aspect, a DCIM bit cell circuit is disclosed. The DCIM bit cell circuit comprises a ground voltage node, a plurality of column output lines, and a memory bit cell circuit configured to store a true weight data on a true bit line and store a complement weight data on a complement bit line, wherein the memory bit cell circuit comprises a complement pull-down transistor configured to couple the complement bit line to the ground voltage node in response to the true weight data. The DCIM bit cell circuit also comprises a multiply circuit comprising a product signal line configured to couple to one of the plurality of column output lines, an activation input configured to receive an activation input signal, and a weight data signal line coupled to the true bit line of the memory bit cell circuit, wherein the multiply circuit is configured to couple the product signal line to the ground voltage node in response to the activation input signal and the true weight data.

In another exemplary aspect, a method of operating a DCIM bit cell array circuit is disclosed. The method comprising in a first column of bit cell circuits coupling a first column output line to a first bit cell circuit of the first column of bit cell circuits, coupling a second column output line to a second bit cell circuit of the first column of bit cell circuits, coupling a product signal line of the first bit cell circuit to the first column output line, and coupling a product signal line of the second bit cell circuit to the second column output line. The method further comprises, in each of the first bit cell circuit and the second bit cell circuit, storing a true weight data on a true bit line of a memory bit cell circuit and storing a complement weight data on a complement bit line of the memory bit cell circuit. The method also includes, in each of the first bit cell circuit and the second bit cell circuit, coupling the complement bit line to a ground voltage node in response to the true weight data, receiving an activation input signal on an activation input, and generating a result of a multiply operation of the activation input signal and the true weight data on the product signal line, comprising coupling the product signal line to the ground voltage node in response to the activation input signal and the true weight data.

DETAILED DESCRIPTION

Figure 1:
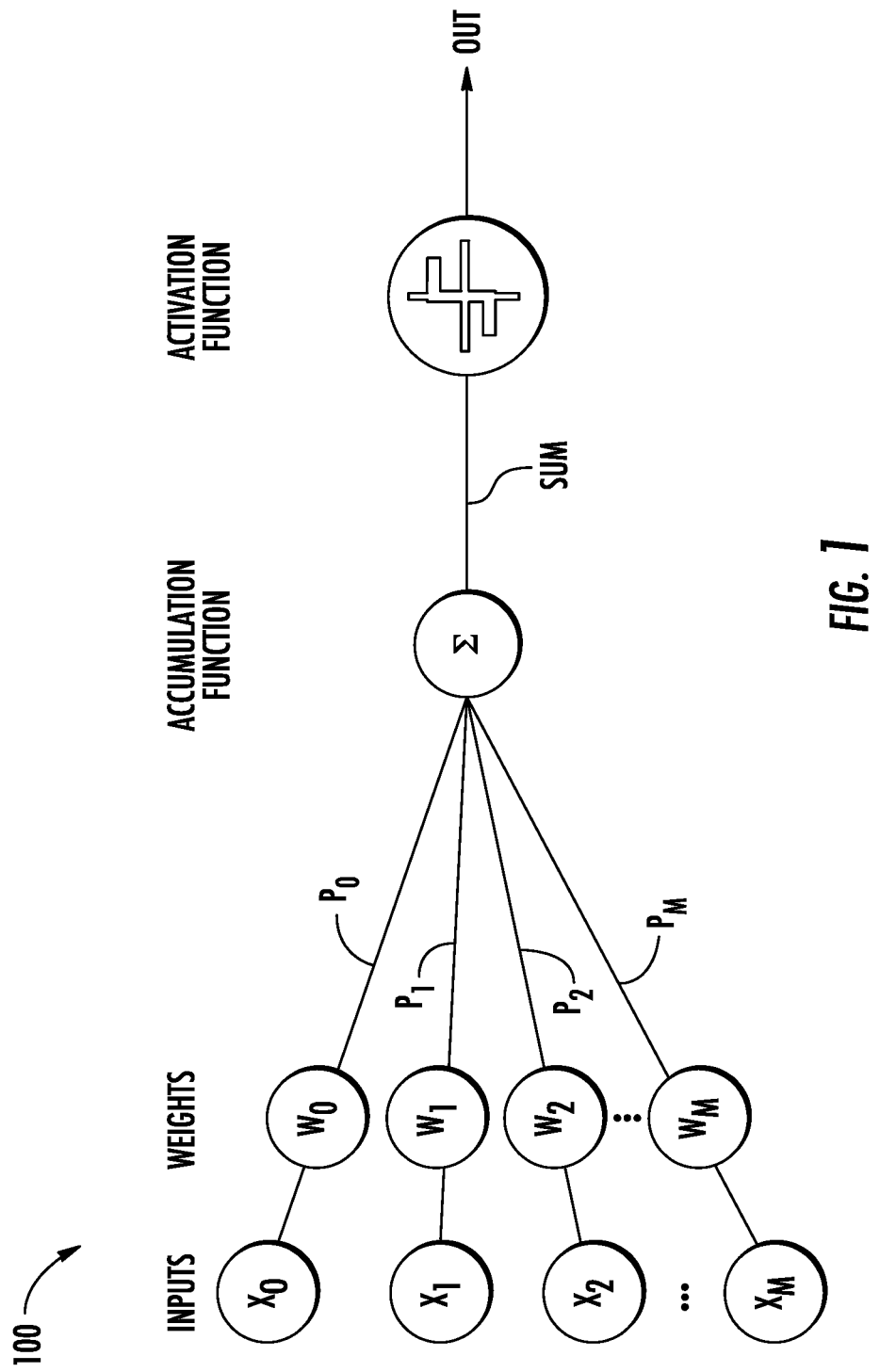
FIG. 1 is a block diagram of a neural network node for performing a multiply-accumulate (MAC) operation.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include digital compute-in-memory (DCIM) bit cell circuit layouts and DCIM array circuits for multiple operations per column. A DCIM bit cell array circuit including DCIM bit cell circuits comprising exemplary DCIM bit cell circuit layouts disposed in columns is configured to evaluate the results of multiple multiply operations per clock cycle. In exemplary aspects, the DCIM bit cell circuits in the exemplary DCIM bit cell circuit layouts each couple to one of a plurality of column output lines in a column. In this regard, in each cycle of a system clock, each of the plurality of column output lines can receive a result of a multiply operation of a DCIM bit cell circuit coupled to the column output line. Performing and evaluating a plurality of multiply operations per column in each clock cycle can reduce the time to perform a multiply-accumulate (MAC) operation in the DCIM bit cell array circuit. In another exemplary aspect, the DCIM bit cell array circuit includes digital sense amplifiers coupled to each of the plurality of column output bit lines to reliably evaluate a result of a plurality of multiply operations per cycle. This is, for example, in contrast to analog compute-in-memory (CIM) bit cell arrays in which the results of a plurality of multiply operations are merged on a single column output line where analog sense amplifiers attempt to distinguish among a plurality of discrete values with low reliability.

Figure 3A:
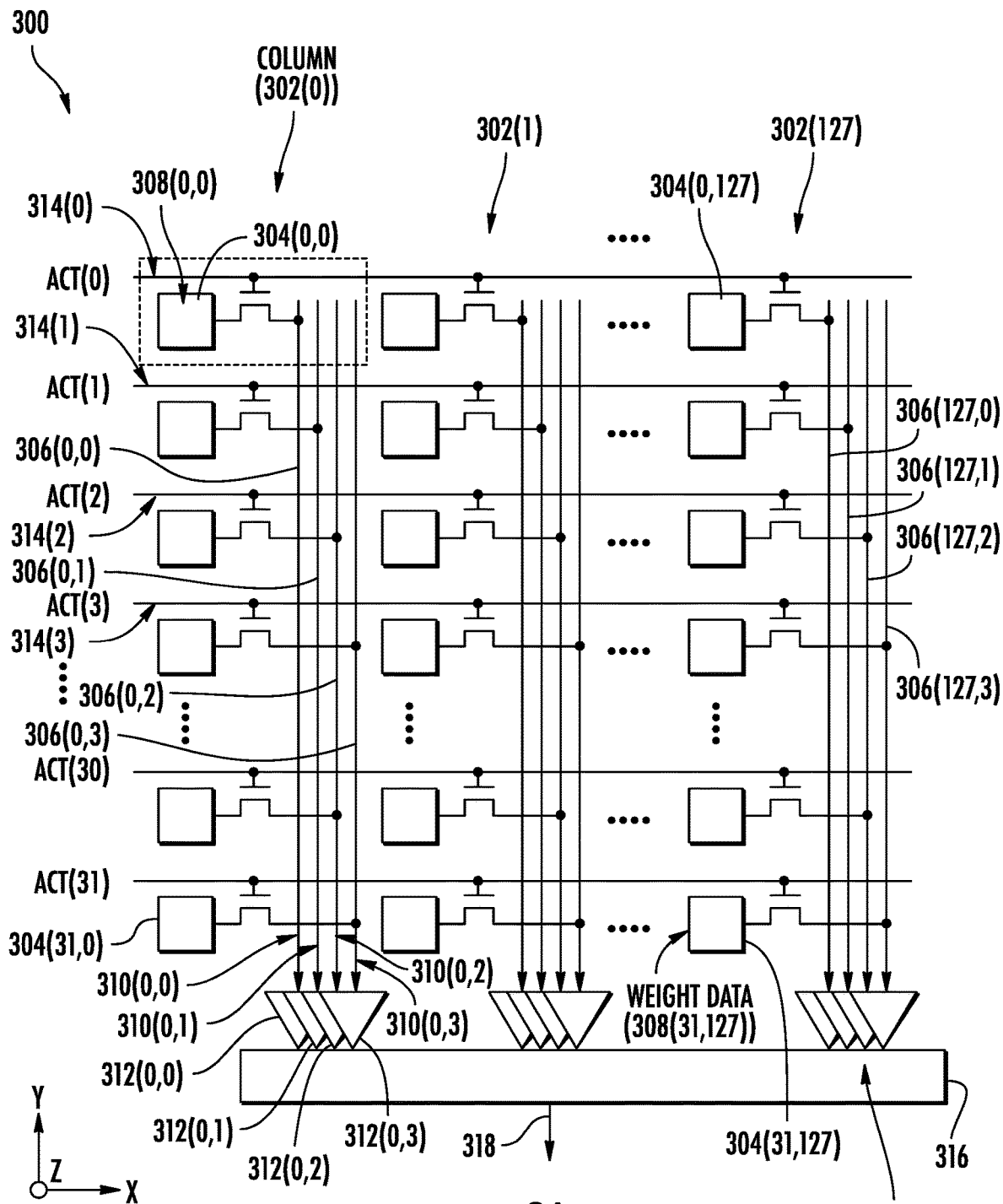
FIG. 3A is an illustration of an exemplary DCIM bit cell array circuit that includes columns of DCIM bit cells circuits each disposed in an exemplary bit cell circuit layout configured to couple to one of a plurality of column output lines and configured to generate, for evaluation, the results of multiple binary multiply operations in a clock cycle.

FIG. 3A is an illustration of an exemplary DCIM bit cell array circuit 300 that includes columns 302(0)-302(127) of DCIM bit cells circuits 304(0,0)-304(31,127). Each of the DCIM bit cells circuits 304(0,0)-304(31,127) is disposed in a bit cell circuit layout (see FIG. 4) configured to couple to one of a plurality of column output lines 306(0,0)-306(127, 3). The column output lines 306(0,0)-306(0,3), as an example, are coupled to the DCIM bit cell circuits 304(0, 0)-304(3,0), respectively. The column output lines 306(0, 0)-306(0,3) are also coupled to the DCIM bit cell circuits 304(4,0)-304(7,0), respectively, the DCIM bit cell circuits 304(8,0)-304(11,0), and so on including the DCIM bit cell circuits 304(28,0)-304(31,0), respectively. The DCIM bit cell circuits 304(0,0)-304(31,0) store weight data 308(0,0)-308(31,0). The results of multiply operations include products 310(0,0)-310(0,3) provided to the column output lines 306(0,0)-306(0,3) in one clock cycle (i.e., period) of a system clock. The products 310(0,0)-310(0,3) may be evaluated by digital sense amplifiers 312(0,0)-312(0,3) in a same clock cycle. It should be understood that digital sequential logic may operate in response to a periodic system clock signal (not shown) that alternates between a low clock state and a high clock state in each clock period. References to a "cycle" or a "clock cycle" herein refer to the period of time corresponding to a cycle of the system clock signal. A state of the system clock may be determined by a signal voltage.

Activation inputs ACT(0)-ACT(3) may be activated to generate activation input signals 314(0)-314(3) in a first cycle of the system clock. The activation inputs ACT(4)-ACT(7) may be activated in a second cycle of the system clock, which may immediately follow the first cycle. The activation inputs ACT(8)-ACT(11) may be activated in a third cycle of the system clock, as so on. In this regard, the results of multiply operations in all (32) of the DCIM bit cell circuits 304(0,0)-304(31,0) in the column 302(0) can be reliably evaluated by the digital sense amplifiers 312(0,0)-312(0,3) in eight (8) cycles. The columns 302(1)-302(127) operate in parallel to the column 302(0). For example, in the first cycle of the system clock, in which the activation inputs ACT(0)-ACT(3) are activated, multiply results are also generated in the DCIM bit cell circuits 304(0,1)-304(3,1) to 304(0,127)-304(3,127). Thus, the multiply results of all the DCIM bit cell circuits 304(0,0)-304(31,127) may be accumulated in 8 cycles. Binary values evaluated by the digital sense amplifiers 312(0,0)-312(0,3) through 312(127,0)-312(127,3) are accumulated in an accumulator circuit 316 during the 8 cycles and a sum 318 is generated.

Figure 3B:
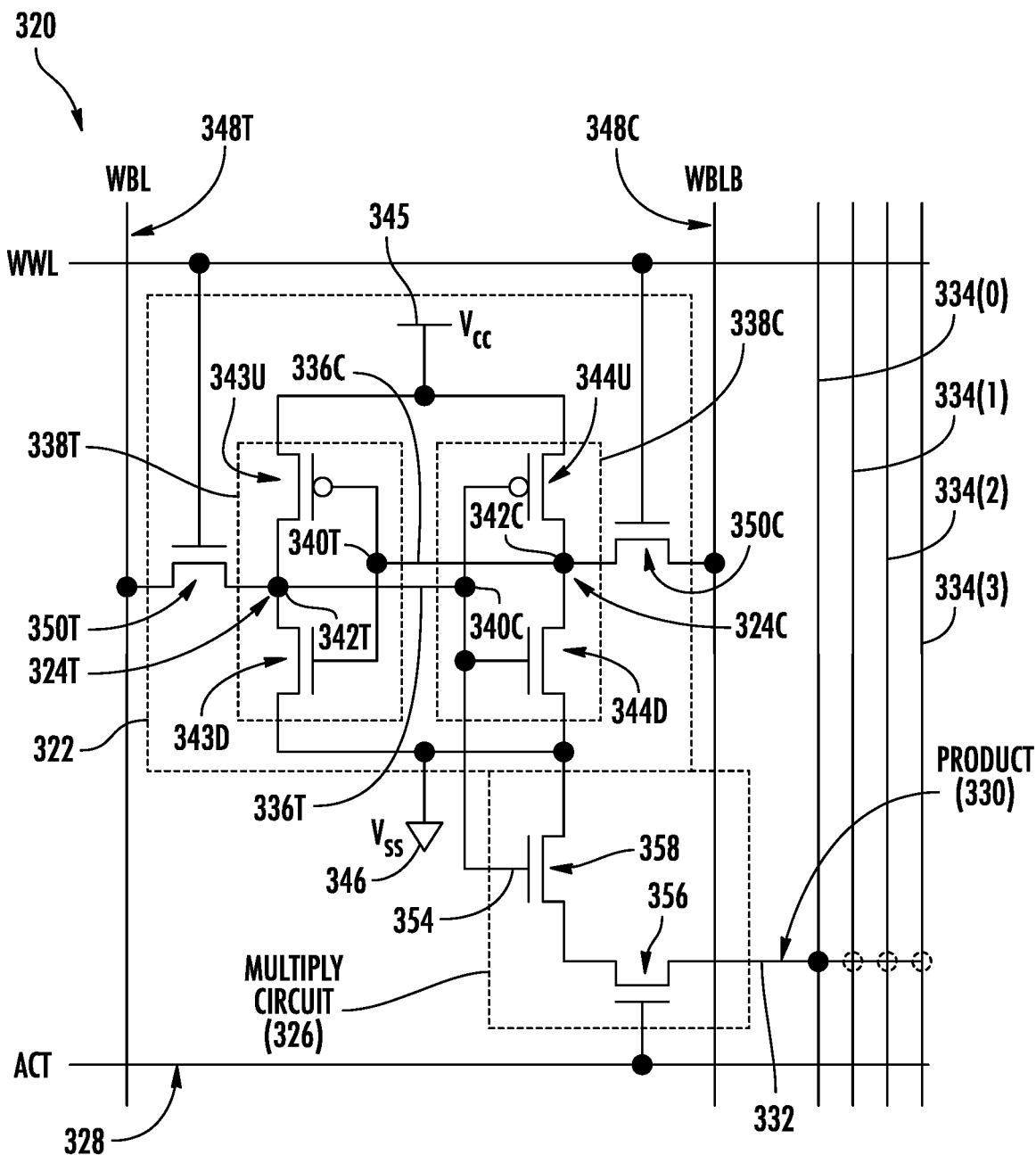
FIG. 3B is a schematic diagram illustrating details of a DCIM bit cell circuit that may be employed in the DCIM bit cell array circuit in FIG. 2, including a memory bit cell circuit and a multiply operation circuit.

FIG. 3B is a schematic diagram of a DCIM bit cell circuit 320 that may be employed in the DCIM bit cell circuits 304(0,0)-304(31,127) in FIG. 3A. The DCIM bit cell circuit 320 includes a memory bit cell circuit 322 for storing a true weight data 324T. The DCIM bit cell circuit 320 also includes a multiply circuit 326 that performs a binary multiply operation of the true weight data 324T and an activation input signal 328 on the activation input ACT. In this example, the multiply circuit 326 generates a result of a 2-bit NOT-AND (NAND) logic operation of the true weight data 324T and the activation input signal 328 as a product 330 on a product signal line 332. The product signal line 332 is configured to couple to any one of column output lines 334(0)-334(3). It should be understood that each of the true weight data 324T, the activation input signal 328, and the product 330 may be in one of a first state corresponding to binary "0" and second state corresponding to a binary "1" where a binary "0" may be represented by a low voltage (e.g., 0 volts, $V_{SS}$) and the binary "1" may be represented by a high voltage (e.g., +1.8 volts, $V_{CC}$). Alternatively, a binary "1" may be represented by a low voltage (e.g., 0 volts, $V_{SS}$) and the binary "0" may be represented by a high voltage (e.g., +1.8 volts, $V_{CC}$).

Regarding the memory bit cell circuit 322, the true weight data 324T is stored on a true bit line 336T and a complement weight data 324C is stored on a complement bit line 336C and is complementary (i.e., logical inverse) to the true weight data 324T. The memory bit cell circuit 322 includes a true inverter circuit 338T and a complement inverter circuit 338C. The true inverter circuit 338T includes a first inverter input 340T and a first inverter output 342T. The first inverter output 342T is coupled to the true bit line 336T. The complement inverter circuit 338C includes a second inverter input 340C that is also coupled to the true bit line 336T. The complement inverter circuit 338C also includes a second inverter output 342C that is coupled to the complement bit line 336C, which is further coupled to the first inverter input 340T. The true inverter circuit 338T includes a true pull-up transistor 343U and a true pull-down transistor 343D. The complement inverter circuit 338C includes a complement pull-up transistor 344U and a complement pull-down transistor 344D. The complement pull-up transistor 344U is coupled to the complement bit line 336C and to a supply voltage node 345 that may provide a supply voltage (e.g., $V_{CC}$). The complement pull-down transistor 344D is configured to couple the complement bit line 336C to a ground voltage node 346 in response to the true weight data 324T. The ground voltage node 346 is coupled to a ground voltage (e.g., $V_{SS}$). Thus, the true inverter circuit 338T and the complement inverter circuit 338C may be referred to as reinforcing cross-coupled inverters. The true weight data 324T and the complement weight data 324C may be changed based on a true write signal 348T on write bit line WBL and a complementary write signal 348C on a complementary write bit line WBLB. The write signals 348T and 348C are generated on the first inverter input 340T and the second inverter input 340C, respectively, in response to a write word line WWL that is configured to turn on pass-gates 350T and 350C.

The multiply circuit 326 includes the product signal line 332 configured to couple to any one of the column output lines 334(0)-334(3). The multiply circuit 326 is configured to receive the activation input signal 328 on the activation input ACT. The multiply circuit 326 also includes a weight data signal line 354 coupled to the true bit line 336T of the memory bit cell circuit 322. The multiply circuit 326 is configured to generate the product 330 comprising a result of the multiply operation of the activation input signal 328 and the true weight data 324T on the product signal line 332. Generating the product 330 on the product signal line 332 comprises coupling the product signal line 332 to the ground voltage node 346 in response to the activation input signal 328 and the true weight data 324T. In an example, the one of the column output lines 334(0)-334(3) to which the product signal line 332 is coupled may be pre-charged. In such case, generating the product 330 on the product signal line 332 may include discharging the one of the column output lines 334(0)-334(3) through the ground voltage node 346 in response to the activation input signal 328 being a binary "1" and the true weight data 324T being a binary "1". In such condition, the one of the column output lines 334(0)-334(3) generates a binary "0" according to the NAND operation. In response to either of the activation input signal 328 and the true weight data 324T being a binary "0", in the example in FIG. 3B, the product signal line 332 does not discharge the one of the column output lines 334(0)-334(3) and, therefore, the one of the column output lines 334(0)-334(3) generates a binary "1". The multiply circuit 326 comprises an activation transistor 356 and a weight transistor 358. The activation transistor 356 couples the product signal line 332 to the weight transistor 358 in response to the activation input signal 328. The weight transistor 358 couples the activation transistor 356 to the ground voltage node 346 in response to the true weight data 324T.

Figure 4:
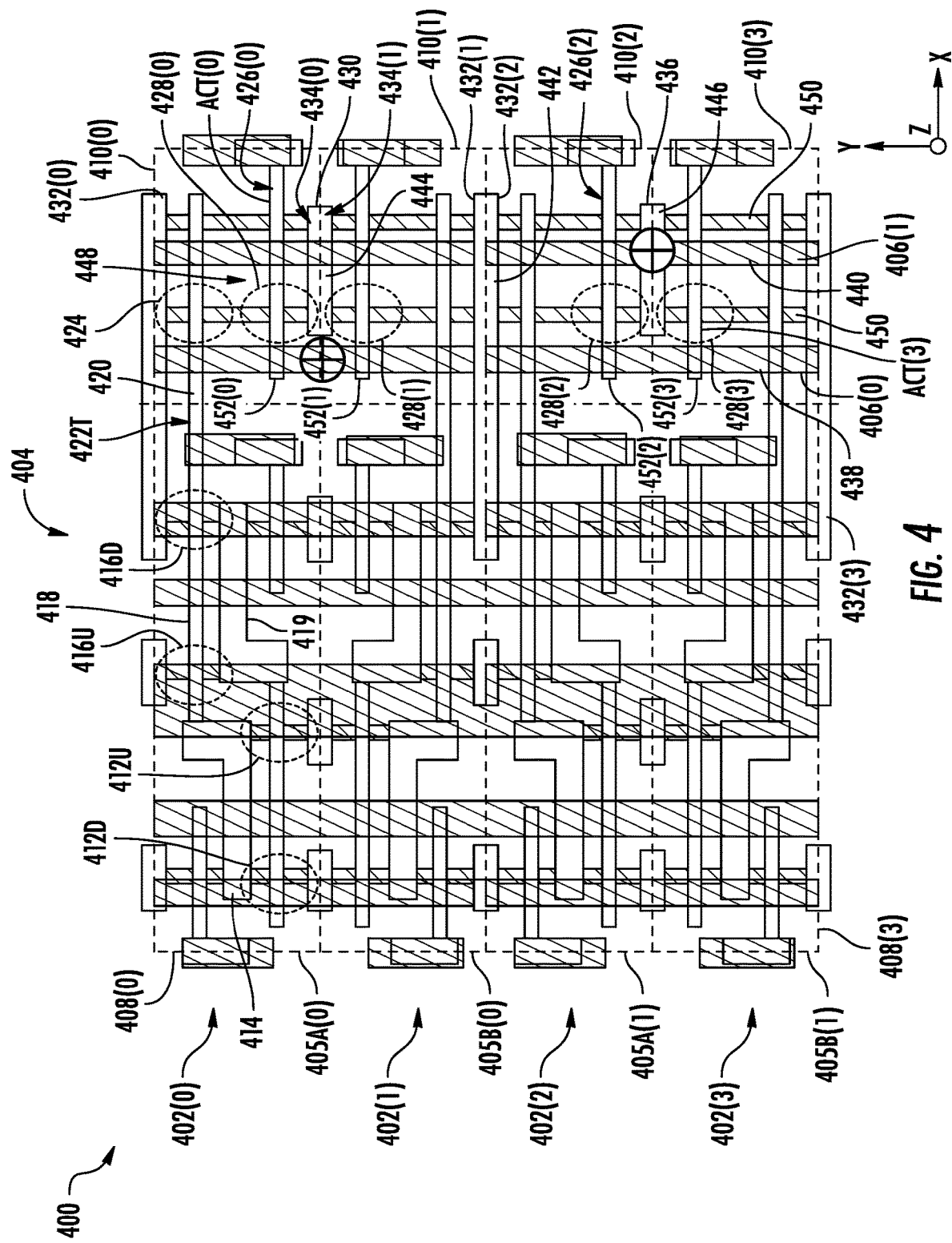
FIG. 4 is an illustration of an array of DCIM bit cell circuits in exemplary DCIM bit cell circuit layouts configured to couple to a plurality of column output lines in a DCIM bit cell array circuit that may generate the results of plural multiply operations in a column in a clock cycle.

FIG. 4 is an illustration of an array 400 of DCIM bit cell circuits 402(0)-402(3) in a column 404 for use in a DCIM bit cell array circuit (not shown) such as the DCIM bit cell array circuit 300 in FIG. 3A. The DCIM bit cell circuits 402(0) and 402(1) are disposed in layouts 405A(0) and 405B(0), respectively. The DCIM bit cell circuits 402(2) and 402(3) are disposed in layouts 405A(1) and 405B(1), respectively. The layouts 405A(0) and 405B(0) are configured to couple to a first column output line 406(0) and the layouts 405A(1) and 405B(1) are configured to couple to a second column output line 406(1). The DCIM bit cell circuits 402(0)-402(3) include memory bit cell circuits 408(0)-408(3) and multiply circuits 410(0)-410(3). The memory bit cell circuits 408(0)-408(3) correspond functionally to the memory bit cell circuit 322 in FIG. 3B and the multiply circuits 410(0)-410(3) correspond to the multiply circuit 326 in FIG. 3B.

Features of the layout 405A(0) of the DCIM bit cell circuit 402(0) are compared to the schematic diagram of the DCIM bit cell circuit 320 in FIG. 3B to clarify aspects of FIG. 4. For example, FIG. 4 shows a true pull-up transistor 412U corresponding to the true pull-up transistor 343U in FIG. 3B, and a true pull-down transistor 412D corresponding to the true pull-down transistor 343D. Both of the true pull-up transistor 412U and the true pull-down transistor 412D are coupled to a first inverter output 414 corresponding to the first inverter output 342T. FIG. 4 also shows a complement pull-up transistor 416U corresponding to the complement pull-up transistor 344 in FIG. 3B and a complement pull-down transistor 416D corresponding to the complement pull-down transistor 344D. A true bit line 418, corresponding to the true bit line 336T in FIG. 3B, is coupled from the first inverter output 414 to a weight data signal line 420 corresponding to the weight data signal line 354. A complement bit line 419 corresponds to the complement bit line 336C in FIG. 3B. A true weight data 422T is provided on the weight data signal line 420, which is coupled to a weight transistor 424. An activation input signal 426(0) is provided to an activation transistor 428(0) on an activation input ACT(0). The activation transistor 428(0) couples the weight transistor 424 to a product signal line 430. Thus, based on the true weight data 422T and the activation input signal 426(0), the product signal line 430 may be coupled to a ground voltage node 432(0), which may be coupled to $V_{SS}$, to indicate a multiply result that corresponds to a low voltage level. The product signal line 430 in the DCIM bit cell circuit 402(0) is coupled to the first column output signal 406(0).

The DCIM bit cell circuit 402(0) in the layout 405A(0) and the DCIM bit cell circuit 402(1) in the layout 405B(0) are mirror images of (i.e., symmetrical to) each other in the Y-direction with respect to the product signal line 430, which extends in the X-axis direction. The product signal line 430 is shared between the DCIM bit cell circuit 402(0) and the DCIM bit cell circuit 402(1). Thus, products 434(0) and 434(1) of the DCIM bit cell circuits 402(0) and 402(1), respectively, may each be provided on the product signal line 430 to the first column output line 406(0). However, in a digital CIM array, such as the DCIM bit cell array circuit 300, one of two logic states may be sensed on the column output line 406(0) in each cycle. Thus, the products 434(0) and 434(1) may not be provided on the column output line 406(0) in a same cycle of a system clock.

The DCIM bit cell circuits 402(2) and 402(3) correspond to the DCIM bit cell circuits 402(0) and 402(1). As noted above, the DCIM bit cell circuits 402(2) and 402(3) are arranged in the layouts 405A(1) and 405B(1), respectively, and share a product signal line 436 that is coupled to the second column output 406(1). Since the product signal line 430 of the DCIM bit cell circuit 402(0) is coupled to the first column output line 406(0) and the product signal line 436 of the DCIM bit cell circuit 402(2) is coupled to the second column output line 406(1), a multiply result can be generated on the first column output line 406(0) from one of the DCIM bit cell circuits 402(0) and 402(1) in the same cycle as another multiply result is generated on the second column output line 406(1) from one of the DCIM bit cell circuits 402(2) and 402(3).

An example of operation in a first cycle and a second cycle is provided. In a first cycle, in response to receiving the activation input signal 426(0) in a first DCIM bit cell circuit (e.g., the DCIM bit cell circuit 402(0)), the result of the multiply operation in the DCIM bit cell circuit 402(0) may be generated on the first column output line 406(0). Also in the first cycle, in response to receiving the activation input signal 426(2) in a second DCIM bit cell circuit (e.g., the DCIM bit cell circuit 402(2)), the result of the multiply operation in the DCIM bit cell circuit 402(2) may be generated on the second column output line 406(2). The product 434(0) may be generated on the first column output line 406(0) while the product 434(2) is generated on the second column output line 406(1) in a first clock cycle (i.e., coincidentally).

In a second clock cycle, in response to receiving the activation input signal 426(1) in a third DCIM bit cell circuit (e.g., the DCIM bit cell circuit 402(1)), the result of the multiply operation in the DCIM bit cell circuit 402(1) may be generated on the first column output line 406(0). Also in the second cycle, in response to receiving the activation input signal 426(3) in a fourth DCIM bit cell circuit (e.g., the DCIM bit cell circuit 402(3)), the result of the multiply operation in the DCIM bit cell circuit 402(3) may be generated on the second column output line 406(1). The product 434(1) may be generated on the first column output line 406(0) as the product 434(3) is generated on the second column output line 406(1), coincidentally, in the second clock cycle. In this regard, the results of multiply operations in all four (4) of the DCIM bit cell circuits 402(0)-402(3) may be evaluated in two (2) cycles (i.e., periods) of a system clock.

In the layout 405A(0), the first column output line 406(0) comprises a metal trace 438 extending in the Y-axis direction. Herein, phrases such as "extending in the Y-axis direction" or "extends in the X-axis direction" with reference to a metal trace or other feature indicates the metal trace or other feature has a longitudinal axis extending or that extends in the Y-axis direction or X-axis direction, accordingly. The second column output line 406(1) comprises a metal trace 440 extending in the Y-axis direction in FIG. 4. The ground voltage node 432(2) of the DCIM bit cell circuit 402(2) comprises a metal trace 442 extending in the X-axis direction n FIG. 4. A ground voltage node 432(1) of the DCIM bit cell circuit 402(1) also comprises the metal trace 442. Thus, the metal trace 442 is shared by the DCIM bit cell circuit 402(1) and the DCIM bit cell circuit 402(2).

The product signal line 430 shared between DCIM bit cell circuits 402(0) and 402(1) comprises a metal trace 444 and the product signal line 436 shared among the DCIM bit cell circuits 402(2) and 402(3) comprises a metal trace 446. The metal traces 444 and 446 extend in the X-axis direction.

The DCIM bit cell circuits 402(0)-402(3) include the activation transistors 428(0)-428(3) disposed consecutively in the Y-axis direction in a diffusion region 448, which may include doped semiconductor material (not shown). The diffusion region 448 may comprise one or more fins 450, for example. The diffusion region 448 may also be a planar region. The activation transistors 428(0)-428(3) may be disposed in the fins 450. The first metal trace 438 is disposed between the memory bit cell circuits 408(0)-408(3) and the activation transistors 428(0)-428(3). The activation inputs ACT(0)-ACT(3) in the DCIM bit cell circuits 402(0)-402(3) comprise metal traces 452(0)-(3) extending in the X-axis direction across the fins 450. In another example shown in FIG. 5, the activation inputs ACT(0)-ACT(3) may be extended in the X-axis direction to accommodate additional column output lines.

Figure 5:
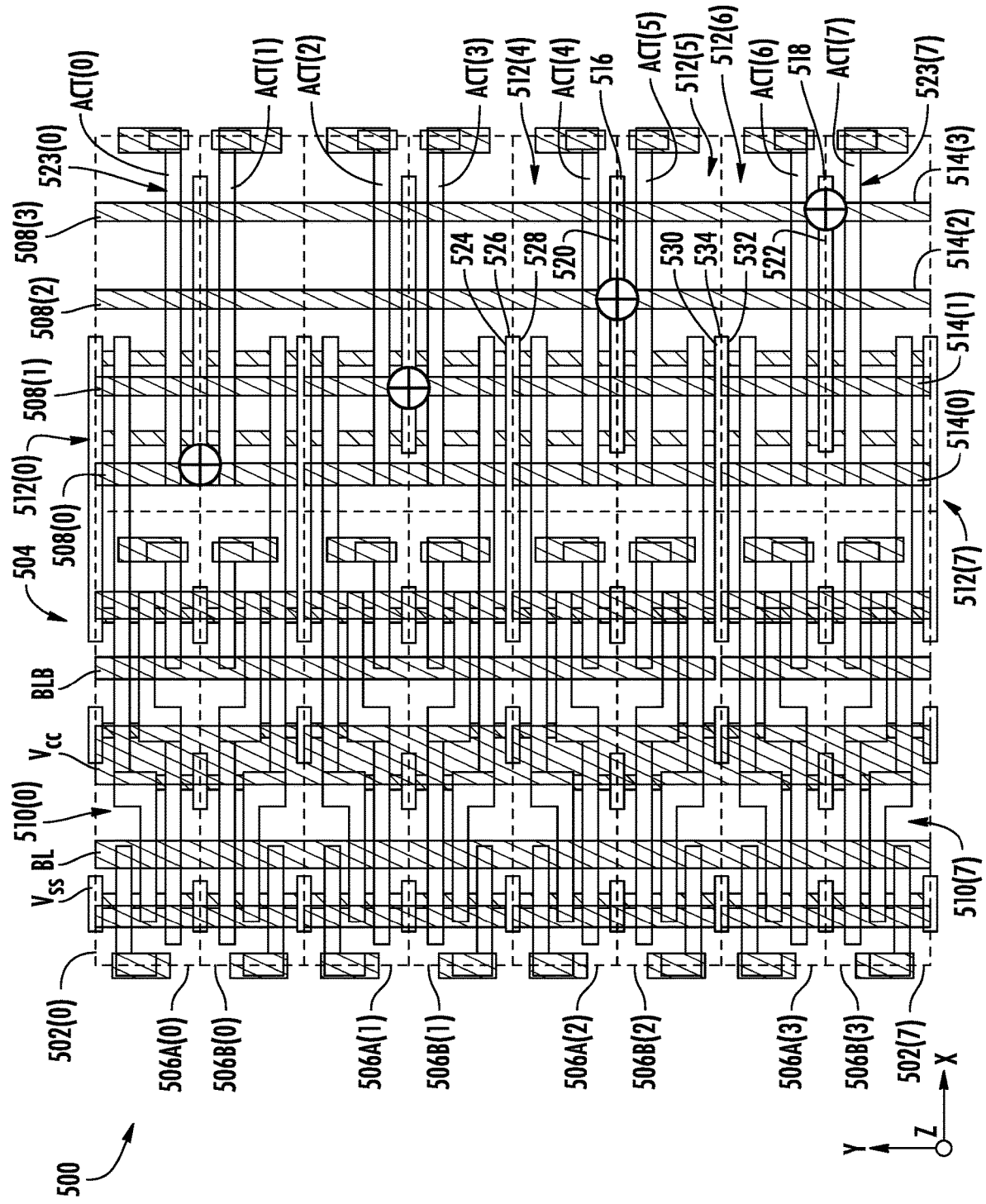
FIG. 5 is an illustration of another array of DCIM bit cell circuits in another exemplary DCIM bit cell circuit layout configured to couple to a plurality of column output lines in a DCIM bit cell array circuit that may generate the results of plural binary multiply operations in a column in a clock cycle.

FIG. 5 is an illustration of an array 500 of DCIM bit cell circuits 502(0)-502(7) disposed in a column 504 for use in the DCIM bit cell circuit 300 in FIG. 3A. The DCIM bit cell circuits 502(0)-502(7) correspond to the DCIM bit cell circuit 320 in FIG. 3B. The DCIM bit cell circuits 502(0) and 502(1) are disposed in mirror image layouts 506A(0) and 506B(0) and are configured to couple to column output line 508(0). The DCIM bit cell circuits 502(2) and 502(3), 502(4) and 502(5), and 502(6) and 502(7) are also disposed in respective mirror image layouts 506A(1) and 506B(1), 506A(2) and 506B(2), and 506A(3) and 506B(3), which are configured to couple to column output lines 508(1)-508(3), respectively. The DCIM bit cell circuits 502(0)-502(7) include memory bit cell circuits 510(0)-510(7) and multiply circuits 512(0)-512(7). The memory bit cell circuits 510(0)-510(3) coupled to the column output lines 508(0) and 508(1) correspond to the memory bit cell circuits 408(0)-408(3) in FIG. 4. The memory bit cell circuits 510(4)-510(7) also correspond to the memory bit cell circuits 408(0)-408(3) in FIG. 4 except that the memory bit cell circuits 510(4)-510(5) couple to column output line 508(2) and the memory bit cell circuits 510(6)-510(7) couple to column output line 508(3). The multiply circuits 512(0)-512(7) correspond in function to the multiply circuits 410(0)-410(3) in FIG. 4. The layouts 506A(0)-506B(3) of multiply circuits 512(0)-512(7) differ from the multiply circuits 410(0)-410(3) in FIG. 4 in that the activation inputs ACT(0)-ACT(7) extend farther in the X-axis direction to extend across the first to fourth column output lines 508(0)-508(3). The first to fourth column output lines 508(0)-508(3) comprise metal traces 514(0)-514(3) extending in the Y-axis direction.

The first and second column output lines 508(0) and 508(1) correspond to the first and second column output lines 406(0)-406(1) in FIG. 4. The multiply circuits 512(0)-512(3) are coupled to the first and second column output lines 508(0) and 508(1). The third column output line 508(2)

is coupled to a product signal line 516 shared by the multiply circuits 512(4) and 512(5), and the fourth column output line 508(3) is coupled to a product signal line 518 shared by the multiply circuits 512(6) and 512(7). The product signal lines 516 and 518 comprise metal traces 520 and 522. The metal traces 520 and 522 extend in the X-axis direction.

As shown, DCIM bit cell circuits 502(0), 502(2), 502(4), and 502(6) are disposed in the DCIM bit cell circuit layouts 506A(0)-506A(3), and the DCIM bit cell circuits 502(1), 502(3), 502(5), and 502(7) are disposed in the DCIM bit cell circuit layouts 506B(0)-506B(3). In response to receiving activation input signals 523(0), 523(2), 523(4), and 523(6), the DCIM bit cell circuits 502(0), 502(2), 502(4), and 502(6) generate results of multiply operations on the column output lines 514(0)-514(3), respectively, in a first cycle of the system clock. In this regard, the DCIM bit cell circuits 502(0), 502(2), 502(4), and 502(6) may be referred to herein as first, second, third, and fourth DCIM bit cell circuits. In response to receiving the activation input signals 523(1), 523(3), 523(5), and 523(7), the DCIM bit cell circuits 502(1), 502(3), 502(5), and 502(7) generate results of multiply operations on the column output lines 514(0)-514(3), respectively, in a second cycle of the system clock. In this regard, the DCIM bit cell circuits 502(1), 502(3), 502(5), and 502(7) may be evaluated in the second cycle of the system clock and may be referred to herein as fifth, sixth, seventh, and eighth DCIM bit cell circuits. Thus, as in the DCIM bit cell array circuit 300 in FIG. 3A, the eight (8) DCIM bit cell circuits 502(0)-502(7) may be evaluated in two (2) cycles of the system clock.

The DCIM bit cell circuits 502(3) includes a ground voltage node 524, which comprises a metal trace 526. The metal trace 526 is shared with the DCIM bit cell circuit 502(4) as a ground voltage node 528. A ground voltage node 530 of the DCIM bit cell circuit 502(5) and a ground voltage 532 of the DCIM bit cell circuit 502(6) comprise a shared metal trace 534. The metal traces 526 and 534 extend in the X-axis direction.

Figure 2:
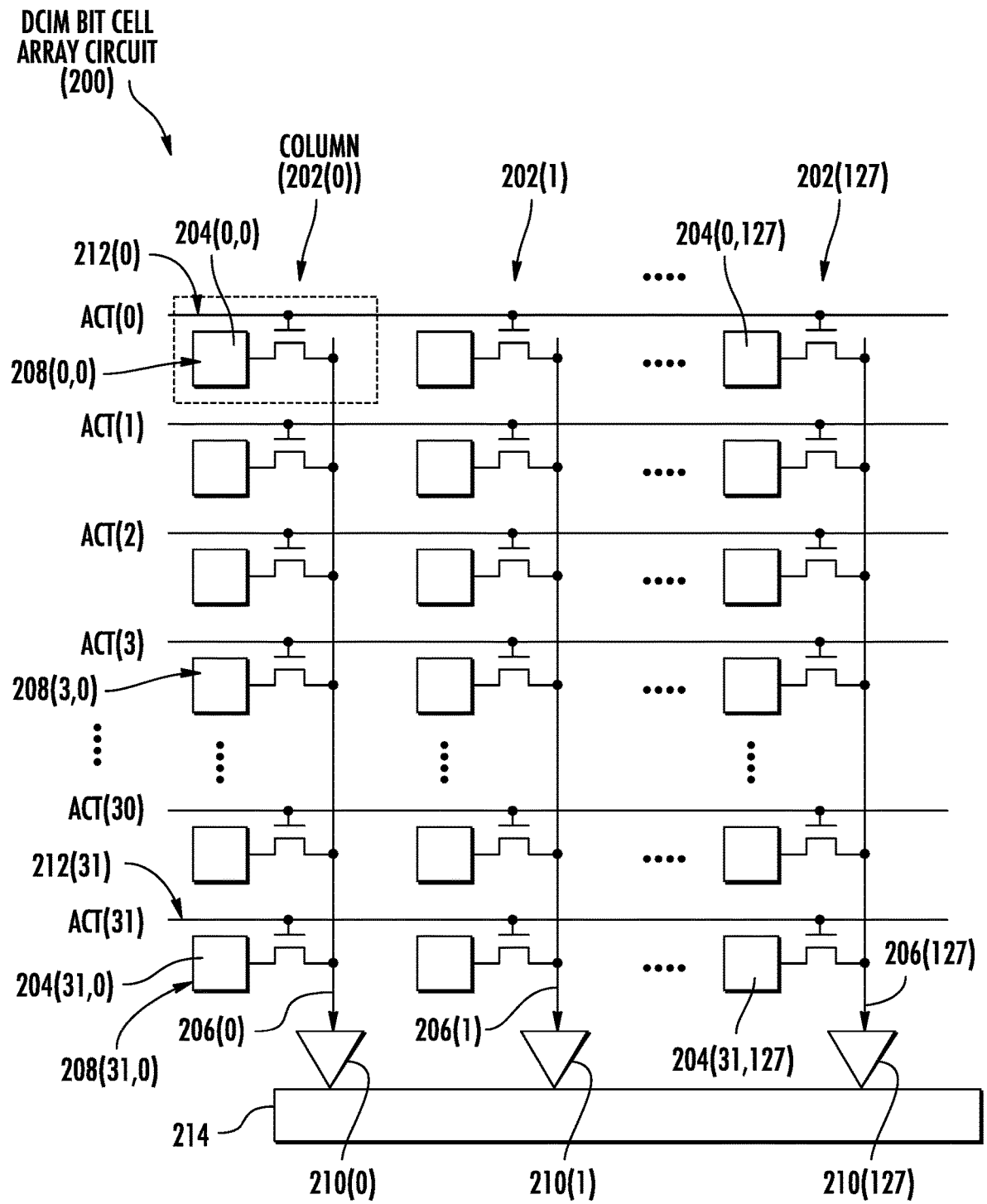
FIG. 2 is an illustration of a digital compute-in-memory (DCIM) bit cell array circuit including columns of DCIM bit cell circuits of a conventional layout coupled to the same column output line configured to generate, for evaluation, the result of one multiply operation in a cycle of a system clock.
Figure 6:
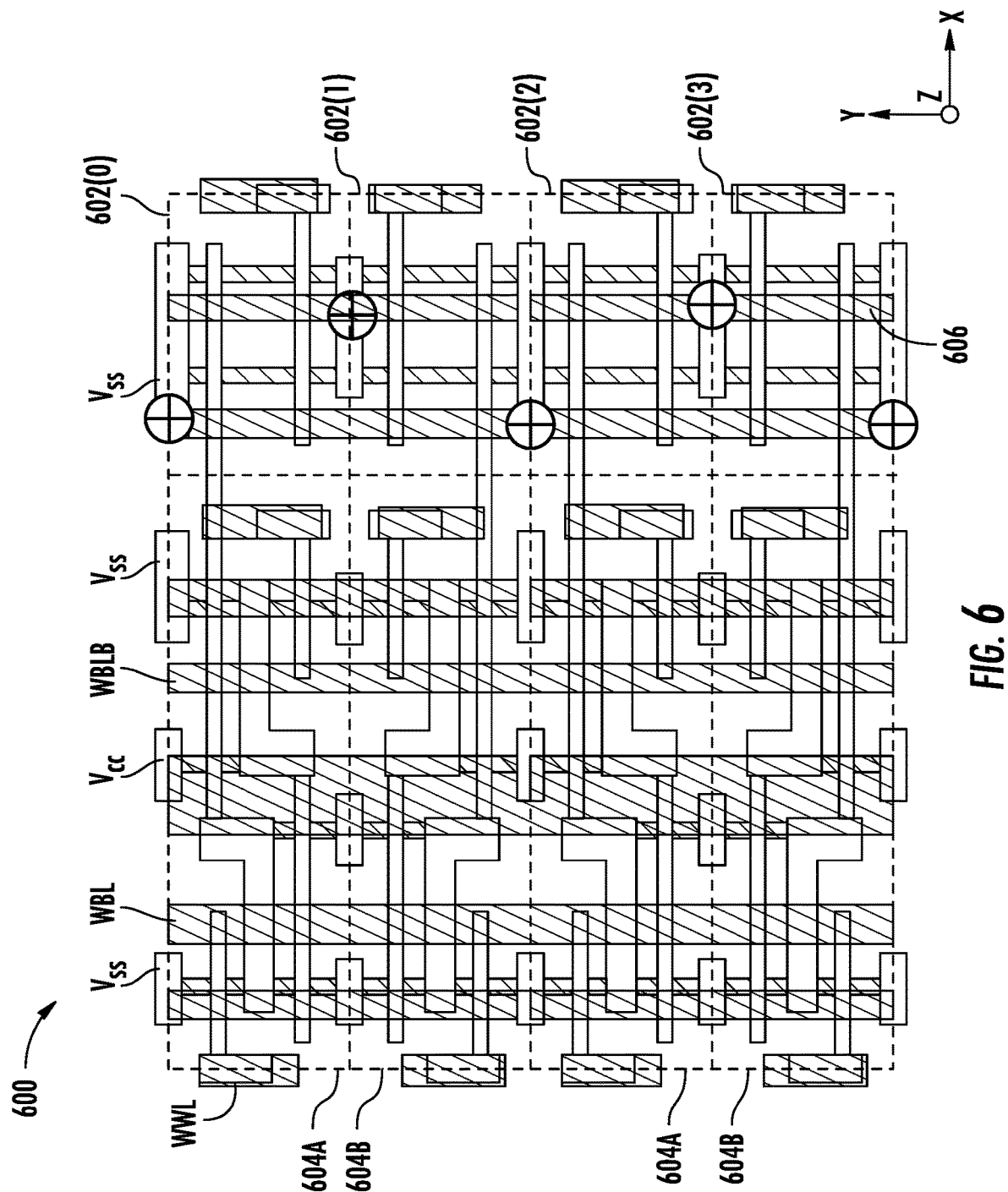
FIG. 6 is an illustration of an array of DCIM bit cell circuits in a conventional layout that may be employed in the DCIM bit cell array circuit in FIG. 2, in which the DCIM bit cell circuits in a column are all coupled to one column output line.

FIG. 6 is an illustration of an array 600 including a plurality of DCIM bit cell circuits 602(0)-602(3) in conventional layouts 604A and 604B employed in the DCIM bit cell array circuit 200 in FIG. 2. The DCIM bit cell circuits 602(0)-602(3) may correspond in function to the DCIM bit cell circuit 320 in FIG. 3B. However, the result of only one multiply operation in the DCIM bit cell circuits 602(0)-602(3) may be generated on the column output line 606 in a cycle of a system clock. In this regard, the conventional layouts 604A and 604B may not be employed in the exemplary DCIM bit cell array circuit 300 in FIG. 3A.

Figure 7:
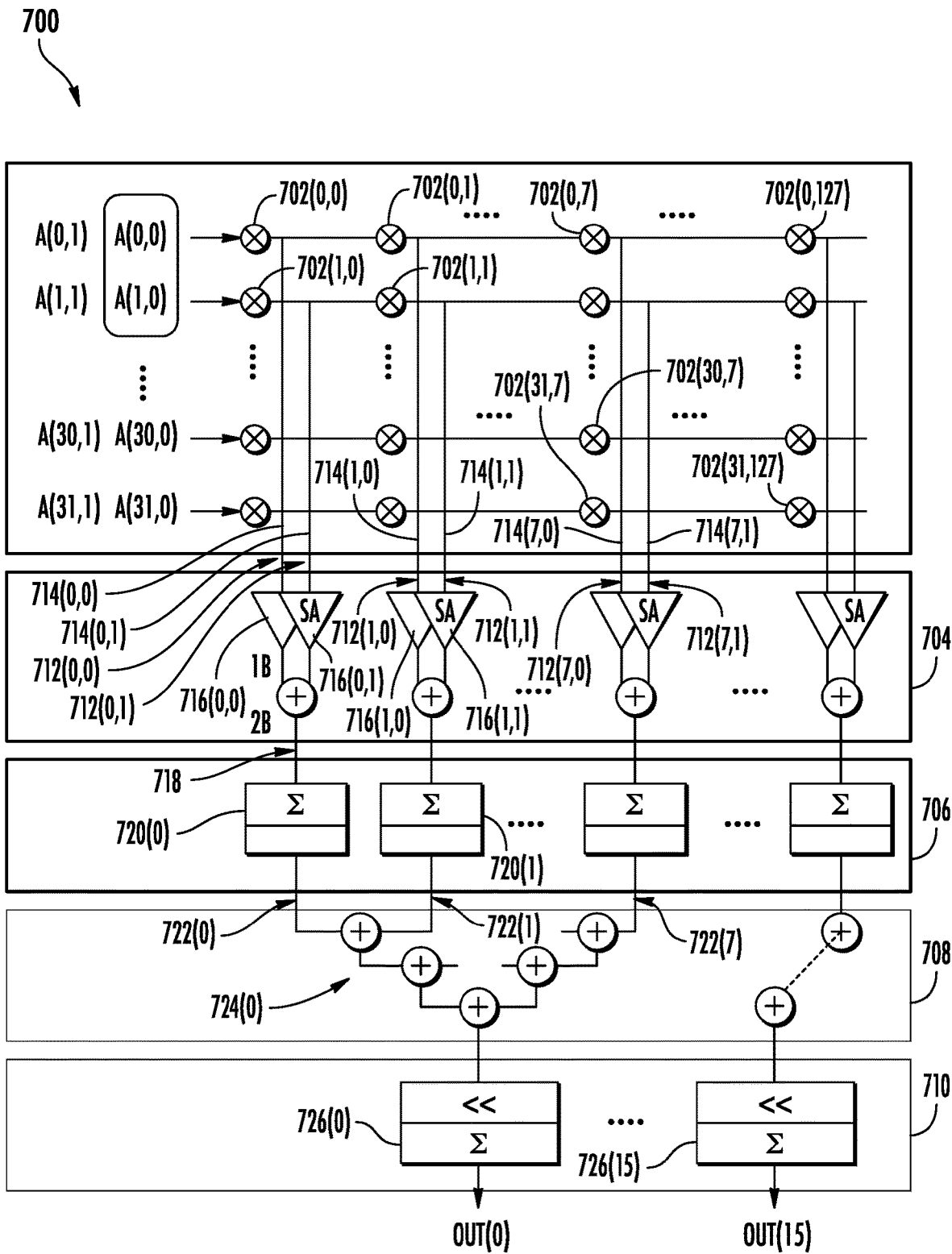
FIG. 7 is a diagram of a DCIM bit cell array circuit employing the DCIM bit cell circuits in the circuit layout illustrated in FIG. 4, and further illustrating circuits for accumulating and summing outputs.

FIG. 7 is a diagram of a DCIM bit cell array circuit 700 employing DCIM bit cell circuits 702(0,0) to 702(31,127) corresponding to the DCIM bit cell circuits 402(0)-402(3) in the circuit layouts 405A(0),405B(0) and 405A(1),405B(1) illustrated in FIG. 4. The DCIM bit cell array circuit 700 further comprises accumulation circuits 704, 706, 708, and 710 for accumulating results of multiply operations in the DCIM bit cell circuits 702 over a plurality of cycles of the system clock to generate an output OUT(0)-OUT(15). In the example shown in FIG. 7, the output OUT(0) is a multi-bit value generated from accumulating results of multiply operations in the DCIM bit cell circuits 702(0,0) to 702(31,7)). In one example, a sequence may begin with activation input signals A(0,0) and A(1,0) being provided to DCIM bit cell circuits 702(0,0) and 702(1,0), respectively and evaluating products 712(0,0) and 712(0,1) on column output lines 714(0,0) and 714(0,1) in a first cycle of a system clock. The products 712(0) and 712(1) may be added together in accumulation circuit 704, for example, and the sum stored in the accumulation circuit 706. In a second cycle, the activation input signals A(2,0) and A(3,0)(not shown) may be provided and the results of the multiply operations in DCIM bit cell circuits 702(2,0) and 702(3,0) provided as products 712(0,0) and 712(0,1) on the column output lines 714(0,0) and 714(0,1), which are added to each other and to the sum stored in the accumulation circuit 706. In a third cycle, the activation input signals A(4,0) and A(5,0) may be provided, and the results on the column output lines 714(0,0) and 714(0,1) are added to each other and to the sum stored in the accumulation circuit 706. This pattern continues to a sixteenth cycle in which activation input signals A(30,0) and A(31,0) are provided and products 712(0,0) and 712(0,1) are evaluated on the column output lines 714(0,0) and 714(0,1). The products 712(0,0) and 712(0,1) are added to each other and to the sum stored in the accumulation circuit 706.

In the same 16 cycles in which the products of all the DCIM bit cell circuits 702(0,0)-702(31,0) are evaluated and summed, the products of all the DCIM bit cell circuit 702(0,1)-702(31,127) are evaluated and summed by columns. In the first cycle, the activation input signals A(0,0) and A(1,0) are provided for multiply operations in all of the DCIM bit cell circuits 702(0,0) to 702(0,127) and 702(1,0) to 702(1,127). In cycle 16, the activation input signals A(30,0) and A(31,0) are provided for multiply operations in the DCIM bit cell circuits 702(30,0) to 702(30,127) and 702(31,0) to 702(31,127).

The outputs OUT(0)-OUT(15) may be generated in the accumulation circuits 704-710. In each of the 16 cycles in which the activation inputs ACT(0)-ACT(31) are activated, sense amplifiers 716(0,0) and 716(0,1) in the accumulation circuit 704 evaluate the products 712(0,0) and 712(0,1) on the column output lines 714(0,0) and 714(0,1), and the product 712(0,0) is added to the product 712(0,1) to generate a 2-bit value 718. An accumulator 720(0) in the accumulator circuit 706 accumulates (i.e., sums) the 2-bit values 718 over cycles 0 to 15 and provides a multi-bit output 722(0) to adders 724(0) in the accumulation circuit 708. Also occurring in the 16 cycles in which the activation inputs ACT(0)-ACT(31) are activated, multi-bit outputs 722(1)-722(127) are accumulated in the accumulation circuit 706. Subsequently, the multi-bit outputs 722(120)-722(127) are summed in groups of eight bits in the accumulation circuit 710 to generate the outputs OUT(0)-OUT(15). For example, the multi-bit outputs 722(0)-722(7) are summed to generate the output OUT(0), the multi-bit outputs 722(8)-722(15) are summed to generate the output OUT(1), and the multi-bit outputs 722(120)-722(127) are summed to generate the output OUT(15).

Figure 8:
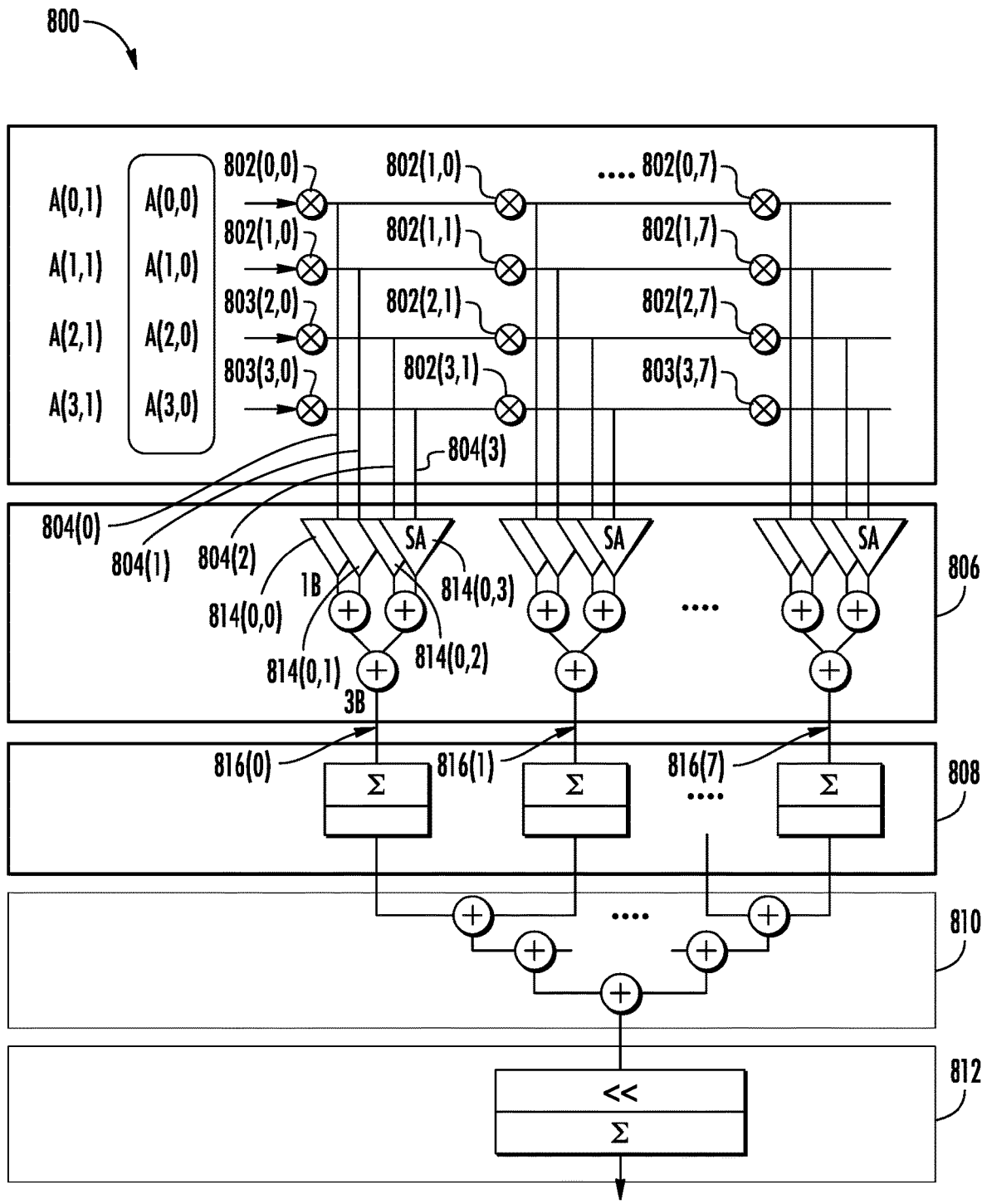
FIG. 8 is a diagram of a DCIM bit cell array circuit employing the DCIM bit cell circuits in the circuit layout illustrated in FIG. 5, and further illustrating circuits for accumulated and summing outputs.

FIG. 8 is a diagram of a DCIM bit cell array circuit 800 including DCIM bit cell circuits 802(0,0) to 802(31,127) in the circuit layouts 506A and 506B corresponding to DCIM bit cell circuits 502(0)-502(7) illustrated in FIG. 5. The DCIM bit cell array circuit 800 includes column output lines 804(0,0) to 804(0,3) coupled to the DCIM bit cell array circuits 802(0,0) to 802(3,0), respectively, and column output lines 804(1,0) to 804(1,3) coupled to the DCIM bit cell array circuits 802(0,1) to 802(3,1), respectively, etc. The DCIM bit cell array 800 includes accumulation circuits 806, 808, 810, and 812 that correspond generally to accumulation circuits 704, 706, 708, and 710 in FIG. 7, except that the accumulation circuit 806 includes four (4) sense amplifiers 814(0,0) to 814(0,3) coupled to the column output lines 804(0,0) to 804(0,3), which allows twice as many results to be evaluated per cycle as the sense amplifiers 716(0,0) and 716(0,1) coupled to the column output lines 714(0,0) and 714(0,1) in FIG. 7. Thus, the accumulation circuit 806 generates 3-bit values 816(0)-816(7), and each of the accumulation circuits 808, 810, and 812 operate on wider binary values to generate the outputs OUT(0) to OUT(15). The accumulation circuit 806 accumulates the results of 4096 multiply operations in approximately eight (8) cycles of the system clock. In addition, employing digital sense amplifiers 814(0,0) to 814(0,3) provides more reliable results that an analog CIM bit cell array circuit having the same performance.

Figure 9A:
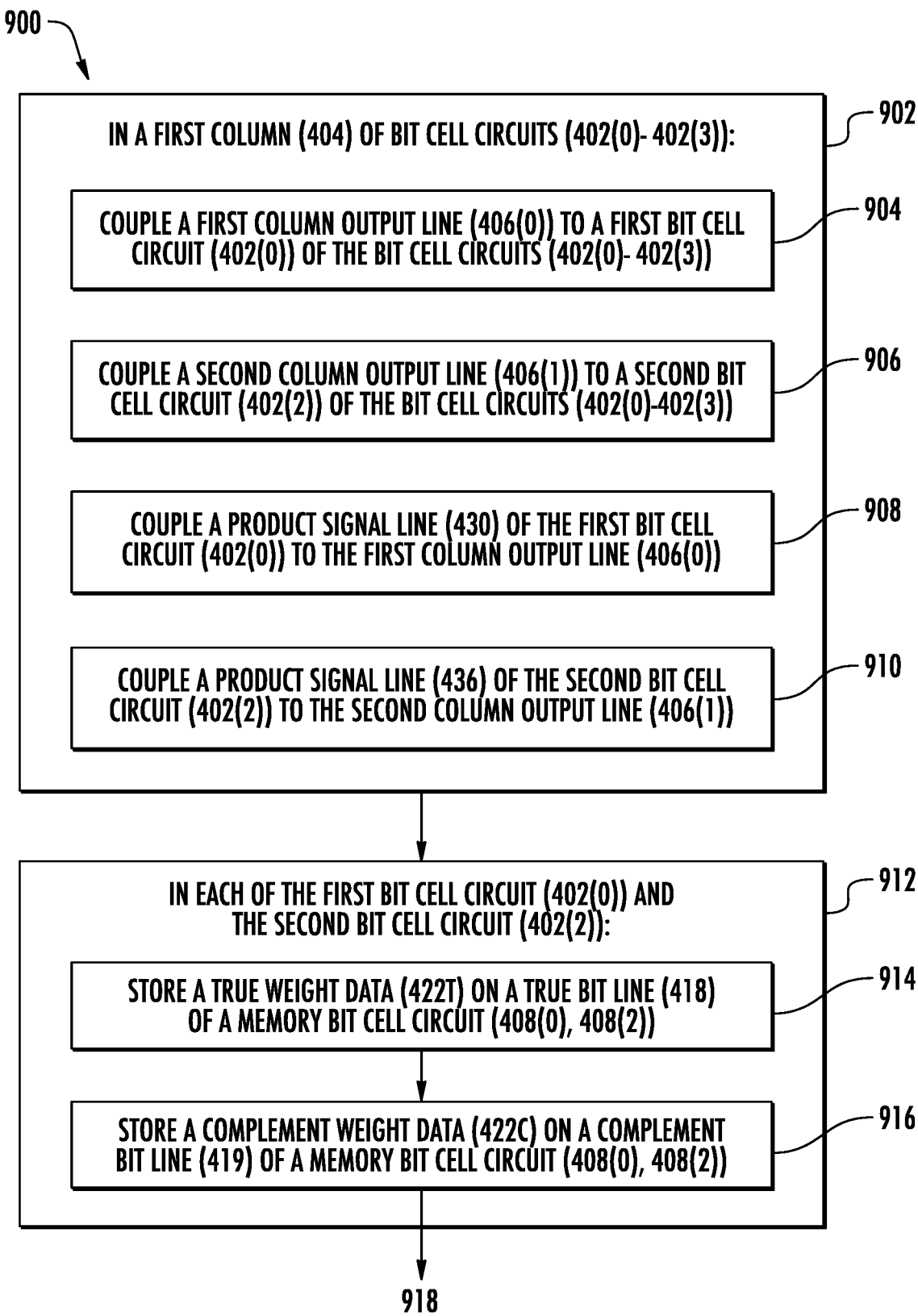
FIGS. 9A and 9B are a flowchart of a method in a DCIM bit cell array circuit configured to evaluate a plurality of results of multiply operations in a clock cycle.
Figure 9B:
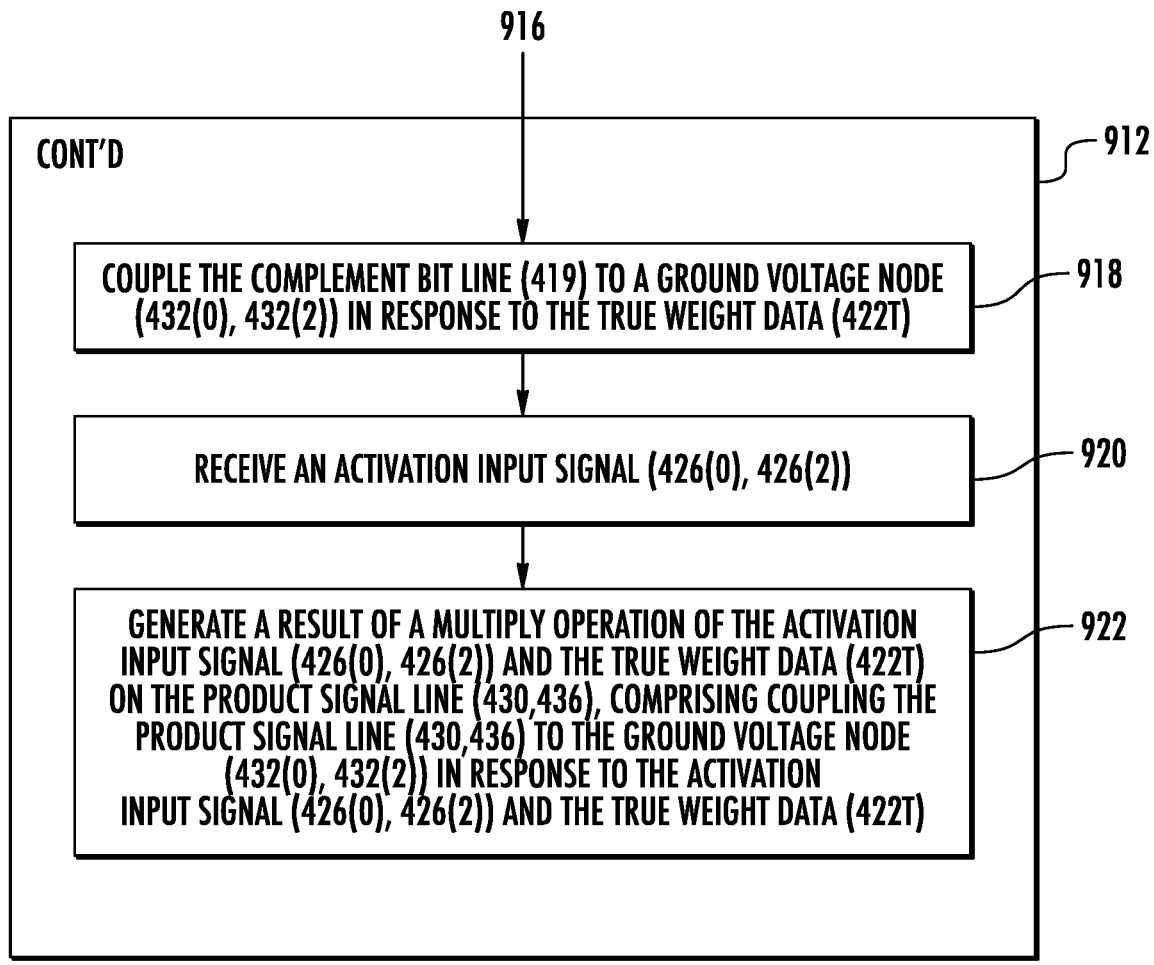

FIGS. 9A and 9B are a flowchart of a method 900 in a DCIM bit cell array circuit 400, the method comprising, in a first column 404 of bit cell circuits 402(0)-402(3) (block 902), coupling a first column output line 406(0) to a first bit cell circuit 402(0) of the bit cell circuits 402(0)-402(3) (block 904) and coupling a second column output line 406(1) to a second bit cell circuit 402(2) of the bit cell circuits 402(0)-402(3) (block 906). The method includes coupling a product signal line 430 of the first bit cell circuit 402(0) to the first column output line 406(0) (block 908) and coupling a product signal line 436 of the second bit cell circuit 402(2) to the second column output line 406(1) (block 910). The method further includes, in each of the first bit cell circuit 402(0) and the second bit cell circuit 402(2) (block 912), storing a true weight data 422T on a true bit line 418 of a memory bit cell circuit 408(0),408(2) (block 914) and storing a complement weight data 422C on a complement bit line 419 of the memory bit cell circuit 408(0), 408(2) (block 916). The method further includes, in each of the first bit cell circuit 402(0) and the second bit cell circuit (402(2), coupling the complement bit line 419 to a ground voltage node 432(0), 432(2) in response to the true weight data 422T (block 918), receiving an activation input signal 426(0), 426(2) (block 920), and generating a result of a multiply operation of the activation input signal 426(0), 426(2) and the true weight data 422T on the product signal line 430, 436, comprising coupling the product signal line 430, 436 to the ground voltage node 432(0), 432(2) in response to the activation input signal 426(0), 426(2) and the true weight data 422T (block 922).

Figure 10:
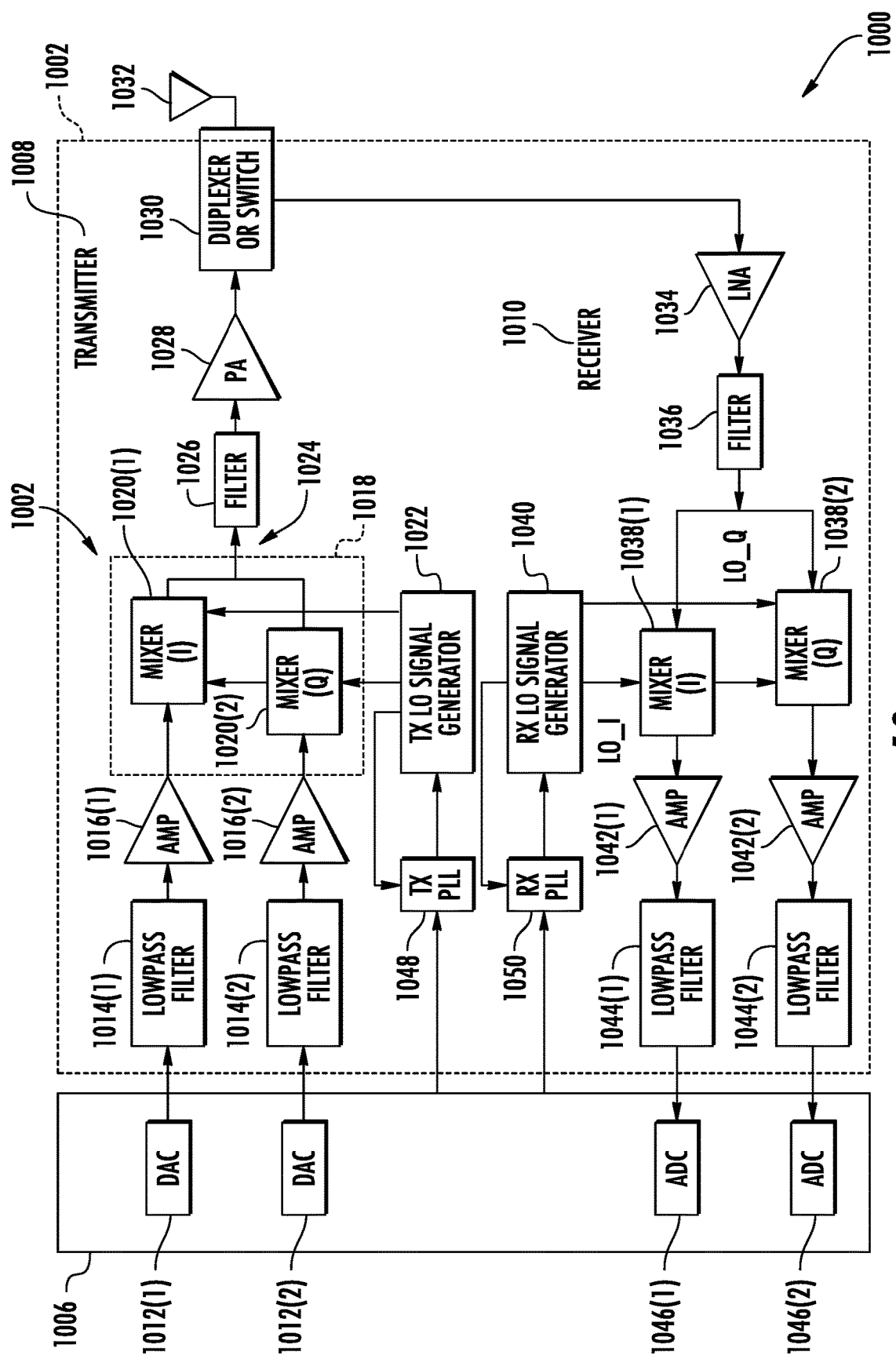
FIG. 10 is a block diagram of an exemplary wireless communications device that includes a radio frequency (RF) module including a DCIM bit cell array circuit including DCIM bit cell circuits in exemplary DCIM bit cell circuit layouts configured to couple to one of a plurality of column output lines and generate results of plural multiply operations for evaluation in a clock cycle, as illustrated in FIGS. 3A, 4, 5, 7, and 8.

FIG. 10 illustrates an exemplary wireless communications device 1000 that includes radio frequency (RF) components formed from one or more integrated circuits (ICs) 1002, wherein any of the ICs 1002 can include a DCIM bit cell array circuit including DCIM bit cell circuits disposed in DCIM bit cell circuit layouts configured to couple to a plurality of column output lines and configured to evaluate a plurality of product signals in each clock cycle, as illustrated in FIGS. 3A, 4, 5, 7, and 8, and according to any of the aspects disclosed herein. The wireless communications device 1000 may include or be provided in any of the above-referenced devices, as examples. As shown in FIG. 10, the wireless communications device 1000 includes a transceiver 1004 and a data processor 1006. The data processor 1006 may include a memory to store data and program codes. The transceiver 1004 includes a transmitter 1008 and a receiver 1010 that support bi-directional communications. In general, the wireless communications device 1000 may include any number of transmitters 1008 and/or receivers 1010 for any number of communication systems and frequency bands. All or a portion of the transceiver 1004 may be implemented on one or more analog ICs, RFICs, mixed-signal ICs, etc.

The transmitter 1008 or the receiver 1010 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1000 in FIG. 10, the transmitter 1008 and the receiver 1010 are implemented with the direct-conversion architecture.

In the transmit path, the data processor 1006 processes data to be transmitted and provides I and Q analog output signals to the transmitter 1008. In the exemplary wireless communications device 1000, the data processor 1006 includes digital-to-analog converters (DACs) 1012(1), 1012 (2) for converting digital signals generated by the data processor 1006 into the I and Q analog output signals, e.g., I and Q output currents, for further processing.

Within the transmitter 1008, lowpass filters 1014(1), 1014(2) filter the I and Q analog output signals, respectively, to remove undesired signals caused by the prior digital-to-analog conversion. Amplifiers (AMPs) 1016(1), 1016(2) amplify the signals from the lowpass filters 1014(1), 1014 (2), respectively, and provide I and Q baseband signals. An upconverter 1018 upconverts the I and Q baseband signals with I and Q transmit (TX) local oscillator (LO) signals from a TX LO signal generator 1022 through mixers 1020(1), 1020(2) to provide an upconverted signal 1024. A filter 1026 filters the upconverted signal 1024 to remove undesired signals caused by the frequency upconversion as well as noise in a receive frequency band. A power amplifier (PA) 1028 amplifies the upconverted signal 1024 from the filter 1026 to obtain the desired output power level and provides a transmit RF signal. The transmit RF signal is routed through a duplexer or switch 1030 and transmitted via an antenna 1032.

In the receive path, the antenna 1032 receives signals transmitted by base stations and provides a received RF signal, which is routed through the duplexer or switch 1030 and provided to a low noise amplifier (LNA) 1034. The duplexer or switch 1030 is designed to operate with a specific receive (RX)-to-TX duplexer frequency separation, such that RX signals are isolated from TX signals. The received RF signal is amplified by the LNA 1034 and filtered by a filter 1036 to obtain a desired RF input signal. Down-conversion mixers 1038(1), 1038(2) mix the output of the filter 1036 with I and Q RX LO signals (i.e., LO_I and LO_Q) from an RX LO signal generator 1040 to generate I and Q baseband signals. The I and Q baseband signals are amplified by AMPs 1042(1), 1042(2) and further filtered by lowpass filters 1044(1), 1044(2) to obtain I and Q analog input signals, which are provided to the data processor 1006. In this example, the data processor 1006 includes analog-to-digital converters (ADCs) 1046(1), 1046(2) for converting the analog input signals into digital signals to be further processed by the data processor 1006.

In the wireless communications device 1000 of FIG. 10, the TX LO signal generator 1022 generates the I and Q TX LO signals used for frequency upconversion, while the RX LO signal generator 1040 generates the I and Q RX LO signals used for frequency downconversion. Each LO signal is a periodic signal with a particular fundamental frequency. A TX phase-locked loop (PLL) circuit 1048 receives timing information from the data processor 1006 and generates a control signal used to adjust the frequency and/or phase of the TX LO signals from the TX LO signal generator 1022. Similarly, an RX PLL circuit 1050 receives timing information from the data processor 1006 and generates a control signal used to adjust the frequency and/or phase of the RX LO signals from the RX LO signal generator 1040.

Wireless communications devices 1000 that each include a DCIM bit cell array circuit including DCIM bit cell circuits disposed in DCIM bit cell circuit layouts configured to couple to a plurality of column output lines and configured to evaluate a plurality of product signals in each clock cycle, as illustrated in FIGS. 3A, 4, 5, 7, and 8, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
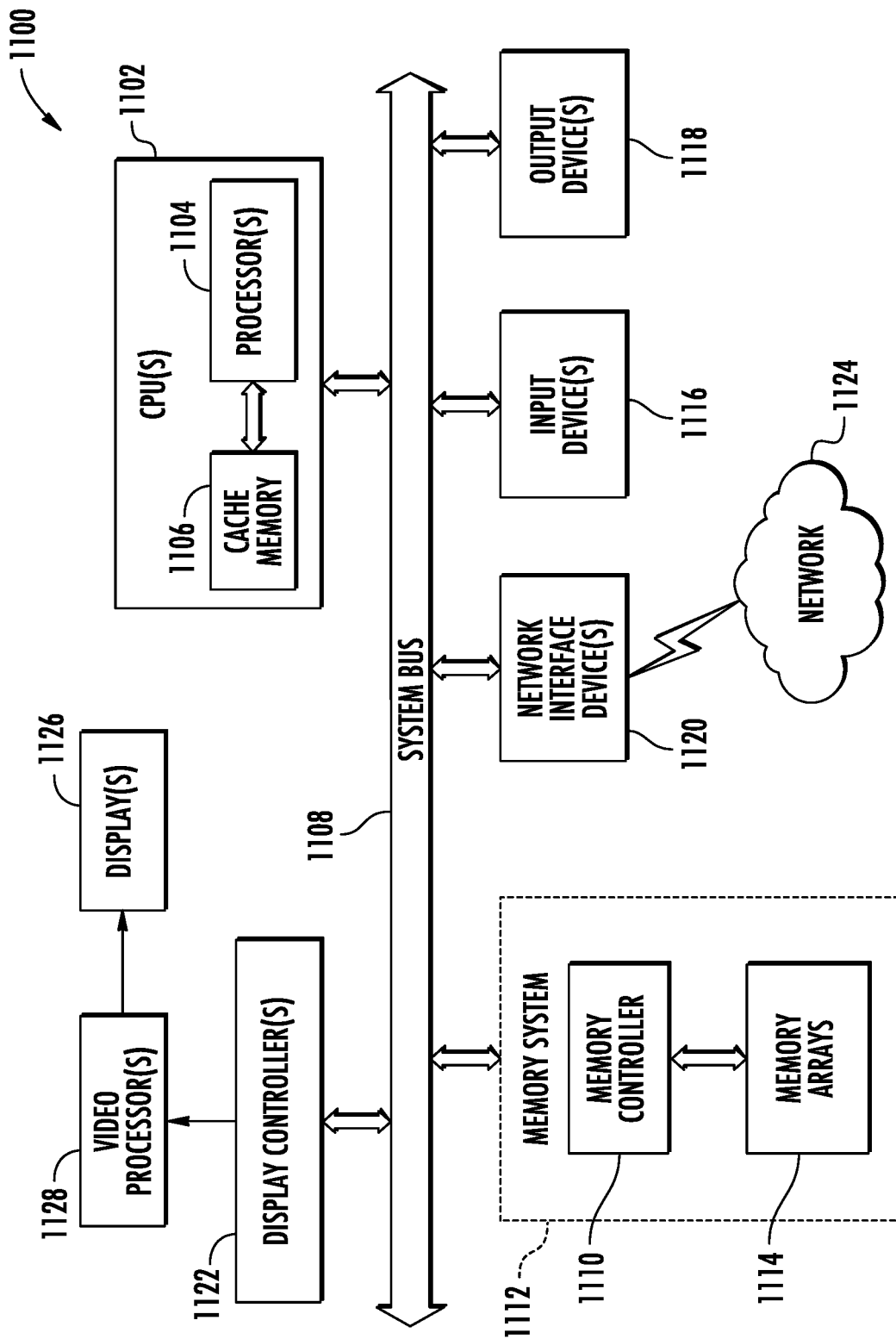
FIG. 11 is a block diagram of an exemplary integrated circuit (IC) package including exemplary IC dies including DCIM bit cell array circuit including DCIM bit cell circuits in exemplary DCIM bit cell circuit layouts configured to couple to one of a plurality of column output lines and generate results of plural multiply operations for evaluation in a clock cycle, as illustrated in FIGS. 3A, 4, 5, 7, and 8, and according to any of the aspects disclosed herein.

In this regard, FIG. 11 illustrates an example of a processor-based system 1100 including ICs including a DCIM bit cell array circuit including DCIM bit cell circuits disposed in DCIM bit cell circuit layouts configured to couple to a plurality of column output lines and configured to evaluate a plurality of product signals in each clock cycle, as illustrated in FIGS. 3A, 4, 5, 7, and 8, and according to any aspects disclosed herein. In this example, the processor-based system 1100 includes one or more central processor units (CPUs) 1102, which may also be referred to as CPU or processor cores, each including one or more processors 1104. The CPU(s) 1102 may have cache memory 1106 coupled to the processor(s) 1104 for rapid access to temporarily stored data. As an example, the processor(s) 1104 could include a DCIM bit cell array circuit including DCIM bit cell circuits disposed in DCIM bit cell circuit layouts configured to couple to a plurality of column output lines and configured to evaluate a plurality of product signals in each clock cycle, as illustrated in FIGS. 3A, 4, 5, 7, and 8, and according to any aspects disclosed herein. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112 that includes the memory controller 1110 and one or more memory arrays 1114, one or more input devices 1116, one or more output devices 1118, one or more network interface devices 1120, and one or more display controllers 1122, as examples. Each of the memory system 1112, the one or more input devices 1116, the one or more output devices 1118, the one or more network interface devices 1120, and the one or more display controllers 1122 can include a DCIM bit cell array circuit including DCIM bit cell circuits disposed in DCIM bit cell circuit layouts configured to couple to a plurality of column output lines and configured to evaluate a plurality of product signals in each clock cycle, as illustrated in FIGS. 3A, 4, 5, 7, and 8, and according to any of the aspects disclosed herein. The input device(s) 1116 can include any type of input device, including, but not limited to, input keys, switches, voice processors, etc. The output device(s) 1118 can include any type of output device, including, but not limited to, audio, video, other visual indicators, etc. The network interface device(s) 1120 can be any device configured to allow exchange of data to and from a network 1124. The network 1124 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1120 can be configured to support any type of communications protocol desired.

The CPU(s) 1102 may also be configured to access the display controller(s) 1122 over the system bus 1108 to control information sent to one or more displays 1126. The display controller(s) 1122 sends information to the display(s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display, etc. The display controller(s) 1122, display(s) 1126, and/or the video processor(s) 1128 can include a DCIM bit cell array circuit including DCIM bit cell circuits disposed in DCIM bit cell circuit layouts configured to couple to a plurality of column output lines and configured to evaluate a plurality of product signals in each clock cycle, as illustrated in FIGS. 3A, 4, 5, 7, and 8, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A digital compute-in-memory (DCIM) bit cell array circuit comprising:
    a plurality of bit cell circuits in a column of bit cell circuits;
    a first column output line coupled to at least one of the plurality of bit cell circuits in the column of bit cell circuits; and
    a second column output line coupled to at least one of the plurality of bit cell circuits in the column of bit cell circuits;
    the plurality of bit cell circuits comprising a first bit cell circuit and a second bit cell circuit, wherein:
        each of the plurality of bit cell circuits comprises:
            a ground voltage node;
            a memory bit cell circuit configured to:
                store a true weight data on a true bit line; and
                store a complement weight data on a complement bit line; and
            the memory bit cell circuit comprises a complement pull-down transistor configured to couple the complement bit line to the ground voltage node in response to the true weight data; and
            a multiply circuit comprising:
                a product signal line configured to couple to one of the first column output line and the second column output line;
                an activation input configured to receive an activation input signal; and
                a weight data signal line coupled to the true bit line of the memory bit cell circuit; and
                the multiply circuit is configured to generate a result of a multiply operation of the activation input signal and the true weight data on the product signal line comprising coupling the product signal line to the ground voltage node in response to the activation input signal and the true weight data;
        the product signal line of the first bit cell circuit is coupled to the first column output line; and
        the product signal line of the second bit cell circuit is coupled to the second column output line.

2. The DCIM bit cell array circuit of clause 1, the plurality of bit cell circuits further comprising:
    a third bit cell circuit and a fourth bit cell circuit;
    wherein:
        the product signal line of the third bit cell circuit is coupled to the first column output line; and
        the product signal line of the fourth bit cell circuit is coupled to the second column output line.

3. The DCIM bit cell array circuit of clause 2, wherein:
    the first column output line comprises a first metal trace extending in a first direction;
    the second column output line comprises a second metal trace extending in the first direction; and
    the ground voltage node of the second bit cell circuit comprises a third metal trace extending in a second direction orthogonal to the first direction.

4. The DCIM bit cell array circuit of clause 3, wherein the ground voltage node of the third bit cell circuit comprises the third metal trace.

5. The DCIM bit cell array circuit of clause 3 or clause 4, wherein:
    the product signal line of the first bit cell circuit comprises a fourth metal trace extending in the second direction; and
    the product signal line of the third bit cell circuit comprises the fourth metal trace.

6. The DCIM bit cell array circuit of clause 5, wherein:
    the product signal line of the second bit cell circuit comprises a fifth metal trace extending in the second direction; and
    the product signal line of the fourth bit cell circuit comprises the fifth metal trace.

7. The DCIM bit cell array circuit of any of clause 3 to clause 6, further comprising:
    a diffusion region comprising:
        an activation transistor of the first bit cell circuit;
        an activation transistor of the second bit cell circuit; and
        an activation transistor of the third bit cell circuit;

wherein the activation transistor of the third bit cell circuit is between the activation transistor of the first bit cell circuit and the activation transistor of the second bit cell circuit in the first direction.

8. The DCIM bit cell array circuit of clause 7, wherein:
the first column output line is disposed between the memory bit cell circuit and the activation transistor of the third bit cell circuit in the second direction.

9. The DCIM bit cell array circuit of any clause 1 to clause 8, wherein the DCIM bit cell array circuit is further configured to generate, in a first period of a system clock:
in response to receiving the activation input signal in the first bit cell circuit, the result of the multiply operation of the activation input signal and the true weight data in the first bit cell circuit on the first column output line; and
in response to receiving the activation input signal in the second bit cell circuit, the result of the multiply operation of the activation input signal and the true weight data in the second bit cell circuit on the second column output line.

10. The DCIM bit cell array circuit of clause 6, further comprising:
a third column output line coupled to at least one of the plurality of bit cell circuits in the column of bit cell circuits; and
a fourth column output line coupled to at least one of the plurality of bit cell circuits in the column of bit cell circuits;
the plurality of bit cell circuits further comprising a fifth bit cell circuit, a sixth bit cell circuit, a seventh bit cell circuit, and an eighth bit cell circuit:
wherein:
the product signal line of the fifth bit cell circuit is coupled to the third column output line; and
the product signal line of the sixth bit cell circuit is coupled to the fourth column output line.

11. The DCIM bit cell array circuit of clause 10, wherein:
the third column output line comprises a sixth metal trace extending in the first direction;
the fourth column output line comprises a seventh metal trace extending in the first direction;
the ground voltage node of the seventh bit cell circuit comprises an eighth metal trace extending in the second direction; and
the ground voltage node of the sixth bit cell circuit comprises the eighth metal trace.

12. The DCIM bit cell array circuit of clause 11, wherein:
the product signal line of the fifth bit cell circuit comprises a ninth metal trace extending in the second direction; and
the product signal line of the seventh bit cell circuit comprises the ninth metal trace.

13. The DCIM bit cell array circuit of clause 12, wherein:
the product signal line of the sixth bit cell circuit comprises a tenth metal trace extending in the second direction; and
the product signal line of the eighth bit cell circuit comprises the tenth metal trace.

14. The DCIM bit cell array circuit of clause 13, wherein the DCIM bit cell array circuit is further configured to generate, in a first period of a system clock:
in response to receiving the activation input signal in the fifth bit cell circuit, the result of the multiply operation of the activation input signal and the true weight data in the fifth bit cell circuit on the third column output line; and
in response to receiving the activation input signal in the sixth bit cell circuit, the result of the multiply operation of the activation input signal and the true weight data in the sixth bit cell circuit on the fourth column output line.

15. The DCIM bit cell array circuit of any of clause 1 to clause 14, wherein the memory bit cell circuit further comprises:
a true inverter circuit comprising:
a first inverter input coupled to the complement bit line; and
a first inverter output coupled to the true bit line; and
a complement inverter circuit comprising:
a second inverter input coupled to the true bit line; and
a second inverter output coupled to the complement bit line,
wherein the complement inverter circuit comprises:
a complement pull-up transistor coupled to the complement bit line and a supply voltage node.

16. A digital compute-in-memory (DCIM) bit cell circuit comprising:
a ground voltage node;
a plurality of column output lines;
a memory bit cell circuit configured to:
store a true weight data on a true bit line; and
store a complement weight data on a complement bit line,
wherein the memory bit cell circuit comprises a complement pull-down transistor configured to couple the complement bit line to the ground voltage node in response to the true weight data; and
a multiply circuit comprising:
a product signal line configured to couple to one of the plurality of column output lines;
an activation input configured to receive an activation input signal; and
a weight data signal line coupled to the true bit line of the memory bit cell circuit,
wherein the multiply circuit is configured to couple the product signal line to the ground voltage node in response to the activation input signal and the true weight data.

17. A method of operating a digital compute-in-memory (DCIM) bit cell array circuit comprising:
in a first column of bit cell circuits:
coupling a first column output line to a first bit cell circuit of the first column of bit cell circuits;
coupling a second column output line to a second bit cell circuit of the first column of bit cell circuits;
coupling a product signal line of the first bit cell circuit to the first column output line; and
coupling a product signal line of the second bit cell circuit to the second column output line; and
in each of the first bit cell circuit and the second bit cell circuit:
storing a true weight data on a true bit line of a memory bit cell circuit;
storing a complement weight data on a complement bit line of the memory bit cell circuit;
coupling the complement bit line to a ground voltage node in response to the true weight data;
receiving an activation input signal on an activation input; and
generating a result of a multiply operation of the activation input signal and the true weight data on the product signal line, comprising coupling the product signal line to the ground voltage node in response to the activation input signal and the true weight data

What is claimed is:

1. A digital compute-in-memory (DCIM) bit cell array circuit comprising:
a plurality of bit cell circuits in a column of bit cell circuits;
a first column output line coupled to at least one of the plurality of bit cell circuits in the column of bit cell circuits; and
a second column output line coupled to at least one of the plurality of bit cell circuits in the column of bit cell circuits;
the plurality of bit cell circuits comprising a first bit cell circuit and a second bit cell circuit, wherein:
each of the plurality of bit cell circuits comprises:
a ground voltage node;
a memory bit cell circuit configured to:
store a true weight data on a true bit line; and
store a complement weight data on a complement bit line; and
the memory bit cell circuit comprises a complement pull-down transistor configured to couple the complement bit line to the ground voltage node in response to the true weight data; and
a multiply circuit comprising:
a product signal line configured to couple to one of the first column output line and the second column output line;
an activation input configured to receive an activation input signal; and
a weight data signal line coupled to the true bit line of the memory bit cell circuit; and
the multiply circuit is configured to generate a result of a multiply operation of the activation input signal and the true weight data on the product signal line comprising coupling the product signal line to the ground voltage node in response to the activation input signal and the true weight data;
the product signal line of the first bit cell circuit is coupled to the first column output line; and
the product signal line of the second bit cell circuit is coupled to the second column output line.

2. The DCIM bit cell array circuit of claim 1, the plurality of bit cell circuits further comprising:
a third bit cell circuit and a fourth bit cell circuit;
wherein:
the product signal line of the third bit cell circuit is coupled to the first column output line; and
the product signal line of the fourth bit cell circuit is coupled to the second column output line.

3. The DCIM bit cell array circuit of claim 2, wherein:
the first column output line comprises a first metal trace extending in a first direction;
the second column output line comprises a second metal trace extending in the first direction; and
the ground voltage node of the second bit cell circuit comprises a third metal trace extending in a second direction orthogonal to the first direction.

4. The DCIM bit cell array circuit of claim 3, wherein the ground voltage node of the third bit cell circuit comprises the third metal trace.

5. The DCIM bit cell array circuit of claim 3, wherein:
the product signal line of the first bit cell circuit comprises a fourth metal trace extending in the second direction; and
the product signal line of the third bit cell circuit comprises the fourth metal trace.

6. The DCIM bit cell array circuit of claim 5, wherein:
the product signal line of the second bit cell circuit comprises a fifth metal trace extending in the second direction; and
the product signal line of the fourth bit cell circuit comprises the fifth metal trace.

7. The DCIM bit cell array circuit of claim 3, further comprising:
a diffusion region comprising:
an activation transistor of the first bit cell circuit;
an activation transistor of the second bit cell circuit; and
an activation transistor of the third bit cell circuit;
wherein the activation transistor of the third bit cell circuit is between the activation transistor of the first bit cell circuit and the activation transistor of the second bit cell circuit in the first direction.

8. The DCIM bit cell array circuit of claim 7, wherein:
the first column output line is disposed between the memory bit cell circuit and the activation transistor of the third bit cell circuit in the second direction.

9. The DCIM bit cell array circuit of claim 1, wherein the DCIM bit cell array circuit is further configured to generate, in a first period of a system clock:
in response to receiving the activation input signal in the first bit cell circuit, the result of the multiply operation of the activation input signal and the true weight data in the first bit cell circuit on the first column output line; and
in response to receiving the activation input signal in the second bit cell circuit, the result of the multiply operation of the activation input signal and the true weight data in the second bit cell circuit on the second column output line.

10. The DCIM bit cell array circuit of claim 6, further comprising:
a third column output line coupled to at least one of the plurality of bit cell circuits in the column of bit cell circuits; and
a fourth column output line coupled to at least one of the plurality of bit cell circuits in the column of bit cell circuits;
the plurality of bit cell circuits further comprising a fifth bit cell circuit, a sixth bit cell circuit, a seventh bit cell circuit, and an eighth bit cell circuit:
wherein:
the product signal line of the fifth bit cell circuit is coupled to the third column output line; and
the product signal line of the sixth bit cell circuit is coupled to the fourth column output line.

11. The DCIM bit cell array circuit of claim 10, wherein:
the third column output line comprises a sixth metal trace extending in the first direction;
the fourth column output line comprises a seventh metal trace extending in the first direction;
the ground voltage node of the seventh bit cell circuit comprises an eighth metal trace extending in the second direction, and
the ground voltage node of the sixth bit cell circuit comprises the eighth metal trace.

12. The DCIM bit cell array circuit of claim 11, wherein:
the product signal line of the fifth bit cell circuit comprises a ninth metal trace extending in the second direction; and
the product signal line of the seventh bit cell circuit comprises the ninth metal trace.

13. The DCIM bit cell array circuit of claim 12, wherein:
the product signal line of the sixth bit cell circuit comprises a tenth metal trace extending in the second direction; and
the product signal line of the eighth bit cell circuit comprises the tenth metal trace.

14. The DCIM bit cell array circuit of claim 13, wherein the DCIM bit cell array circuit is further configured to generate, in a first period of a system clock:
in response to receiving the activation input signal in the fifth bit cell circuit, the result of the multiply operation of the activation input signal and the true weight data in the fifth bit cell circuit on the third column output line; and
in response to receiving the activation input signal in the sixth bit cell circuit, the result of the multiply operation of the activation input signal and the true weight data in the sixth bit cell circuit on the fourth column output line.

15. The DCIM bit cell array circuit of claim 1, wherein the memory bit cell circuit further comprises:
a true inverter circuit comprising:
a first inverter input coupled to the complement bit line; and
a first inverter output coupled to the true bit line; and
a complement inverter circuit comprising:
a second inverter input coupled to the true bit line; and
a second inverter output coupled to the complement bit line,
wherein the complement inverter circuit comprises:
a complement pull-up transistor coupled to the complement bit line and a supply voltage node.

16. A digital compute-in-memory (DCIM) bit cell circuit comprising:
a ground voltage node;
a plurality of column output lines;
a memory bit cell circuit configured to:
store a true weight data on a true bit line; and
store a complement weight data on a complement bit line,
wherein the memory bit cell circuit comprises a complement pull-down transistor configured to couple the complement bit line to the ground voltage node in response to the true weight data; and
a multiply circuit comprising:
a product signal line configured to couple to one of the plurality of column output lines;
an activation input configured to receive an activation input signal; and
a weight data signal line coupled to the true bit line of the memory bit cell circuit,
wherein the multiply circuit is configured to couple the product signal line to the ground voltage node in response to the activation input signal and the true weight data.

17. A method of operating a digital compute-in-memory (DCIM) bit cell array circuit comprising:
in a first column of bit cell circuits:
coupling a first column output line to a first bit cell circuit of the first column of bit cell circuits;
coupling a second column output line to a second bit cell circuit of the first column of bit cell circuits;
coupling a product signal line of the first bit cell circuit to the first column output line; and
coupling a product signal line of the second bit cell circuit to the second column output line; and
in each of the first bit cell circuit and the second bit cell circuit:
storing a true weight data on a true bit line of a memory bit cell circuit;
storing a complement weight data on a complement bit line of the memory bit cell circuit;
coupling the complement bit line to a ground voltage node in response to the true weight data;
receiving an activation input signal on an activation input; and
generating a result of a multiply operation of the activation input signal and the true weight data on the product signal line, comprising coupling the product signal line to the ground voltage node in response to the activation input signal and the true weight data.

\* \* \* \* \*